United States Patent
Okuda

(10) Patent No.: US 9,979,159 B2
(45) Date of Patent: May 22, 2018

(54) SEMICONDUCTOR LASER AND MANUFACTURING METHOD THEREOF

(71) Applicant: Renesas Electronics Corporation, Tokyo (JP)

(72) Inventor: Tetsuro Okuda, Tokyo (JP)

(73) Assignee: RENESAS ELECTRONICS CORPORATION, Tokyo (JP)

( * ) Notice: Subject to any disclaimer, the term of this patent is extended or adjusted under 35 U.S.C. 154(b) by 193 days.

(21) Appl. No.: 14/873,659

(22) Filed: Oct. 2, 2015

(65) Prior Publication Data
US 2016/0126701 A1 May 5, 2016

(30) Foreign Application Priority Data

Oct. 31, 2014 (JP) .................................. 2014-223689

(51) Int. Cl.
*H01S 5/227* (2006.01)
*H01S 5/22* (2006.01)
(Continued)

(52) U.S. Cl.
CPC .......... *H01S 5/2275* (2013.01); *H01S 5/2222* (2013.01); *H01S 5/2272* (2013.01);
(Continued)

(58) Field of Classification Search
CPC .... H01S 5/2275; H01S 5/2272; H01S 5/2222; H01S 2304/04; H01S 5/2224;
(Continued)

(56) References Cited

U.S. PATENT DOCUMENTS 6,323,507 B1 * 11/2001 Yokoyama .............. H01S 5/227
257/79
7,720,123 B2 * 5/2010 Takiguchi .............. B82Y 20/00
372/46.01
(Continued)

FOREIGN PATENT DOCUMENTS

| JP | 1-300581 A | 12/1989 |
| JP | 8-255950 A | 10/1996 |

(Continued)

OTHER PUBLICATIONS

Japanese Office Action received in corresponding Japanese Application No. 2014-223689 dated Feb. 27, 2018.

*Primary Examiner* — Xinning Niu
(74) *Attorney, Agent, or Firm* — Mattingly & Malur, PC

(57) ABSTRACT

In a semiconductor laser, a block layer is provided on both sides of a mesa-type semiconductor part having an n-type cladding layer, an active layer, and a p-type cladding layer. The block layer has: a p-type block layer formed on the side surface of the mesa-type semiconductor part and over a p-type semiconductor substrate; a high-resistance layer formed over the p-type block layer; and an n-type block layer formed over the high-resistance layer, which has a higher resistance than that of the p-type block layer. By providing the high-resistance layer between the p-type block layer and the n-type block layer, the thickness of the p-type block layer can be controlled and a leakage current (flow of a hole) can be reduced. Further, the distance between the n-type cladding layer and the n-type block layer can be secured, and hence a leakage current (flow of an electron) can be prevented.

8 Claims, 21 Drawing Sheets

(51) Int. Cl.
*H01S 3/08* (2006.01)
*H01S 5/062* (2006.01)
*H01S 5/343* (2006.01)

(52) U.S. Cl.
CPC ....... *H01S 3/08022* (2013.01); *H01S 5/06226* (2013.01); *H01S 5/222* (2013.01); *H01S 5/2224* (2013.01); *H01S 5/34306* (2013.01); *H01S 2304/04* (2013.01)

(58) Field of Classification Search
CPC .. H01S 5/222; H01S 5/06226; H01S 3/08022; H01S 5/34306
See application file for complete search history.

(56) References Cited

U.S. PATENT DOCUMENTS

| | | | |
|---|---|---|---|
| 8,472,490 B2 | 6/2013 | Sakaino | |
| 2002/0145149 A1* | 10/2002 | Kim | ........................ H01S 5/227 257/90 |

FOREIGN PATENT DOCUMENTS

| | | |
|---|---|---|
| JP | 2000-174394 A | 6/2000 |
| JP | 2008-053649 A | 3/2008 |
| JP | 2010-98069 A | 4/2010 |
| JP | 2011-134863 A | 7/2011 |

* cited by examiner

SEMICONDUCTOR LASER AND MANUFACTURING METHOD THEREOF

CROSS-REFERENCE TO RELATED APPLICATIONS

The disclosure of Japanese Patent Application No. 2014-223689 filed on Oct. 31, 2014 including the specification, drawings, and abstract is incorporated herein by reference in its entirety.

BACKGROUND

The present invention relates to a semiconductor laser and a manufacturing method thereof, and can be preferably used, for example, in a mesa-type semiconductor laser.

Semiconductor lasers to be applied in an optical fiber communication technology are under development.

For example, Patent Document 1 (Japanese Unexamined Patent Publication No. 2008-53649) discloses a technique for reducing a leakage current in a buried semiconductor laser.

RELATED ART DOCUMENT

Patent Document

[Patent Document 1] Japanese Unexamined Patent Publication No. 2008-53649

SUMMARY

The present inventors are engaged in the research and development of a semiconductor laser to be applied in an optical fiber communication technology, and study hard to improve the performance thereof. In the course, it has been found that there is room for further improvement to improve the performance of the semiconductor laser in terms of the structure and manufacturing method thereof.

Other problems and new characteristics will become clear from the description and accompanying drawings of the present specification.

Of the preferred embodiments disclosed in the present application, outlines of the typical ones will be briefly described as follows.

A semiconductor laser described in one embodiment disclosed in the present application has: a mesa-type semiconductor part provided over a semiconductor substrate; and a block layer provided on both the sides of the mesa-type semiconductor part. The block layer has: a p-type block layer including a p-type compound semiconductor formed over the side surface of the mesa-type semiconductor part and over the semiconductor substrate; a first resistive layer formed over the p-type block layer and having a resistance larger than that of the p-type block layer; and an n-type block layer including an n-type compound semiconductor formed over the first resistive layer.

A manufacturing method of a semiconductor laser described in one embodiment disclosed in the present application includes a step of forming a mesa-type semiconductor part, in which a p-type compound semiconductor layer, an active layer, and an n-type compound semiconductor layer are formed in this order from below, over a p-type semiconductor substrate. After that, a block layer is formed over the semiconductor substrate on both the sides of the mesa-type semiconductor part. The step of forming the block layer includes the steps of: forming a p-type block layer over the side surface of the mesa-type semiconductor part and over the semiconductor substrate; forming a resistive layer having a resistance larger than that of the p-type block layer over the p-type block layer; and forming an n-type block layer over the resistive layer.

According to a semiconductor laser described in the following typical embodiments disclosed in the present application, the characteristics of the semiconductor laser can be improved.

According to a manufacturing method of a semiconductor laser described in the following typical embodiments disclosed in the present application, a semiconductor laser having good characteristics can be manufactured.

DETAILED DESCRIPTION

Figure 1:
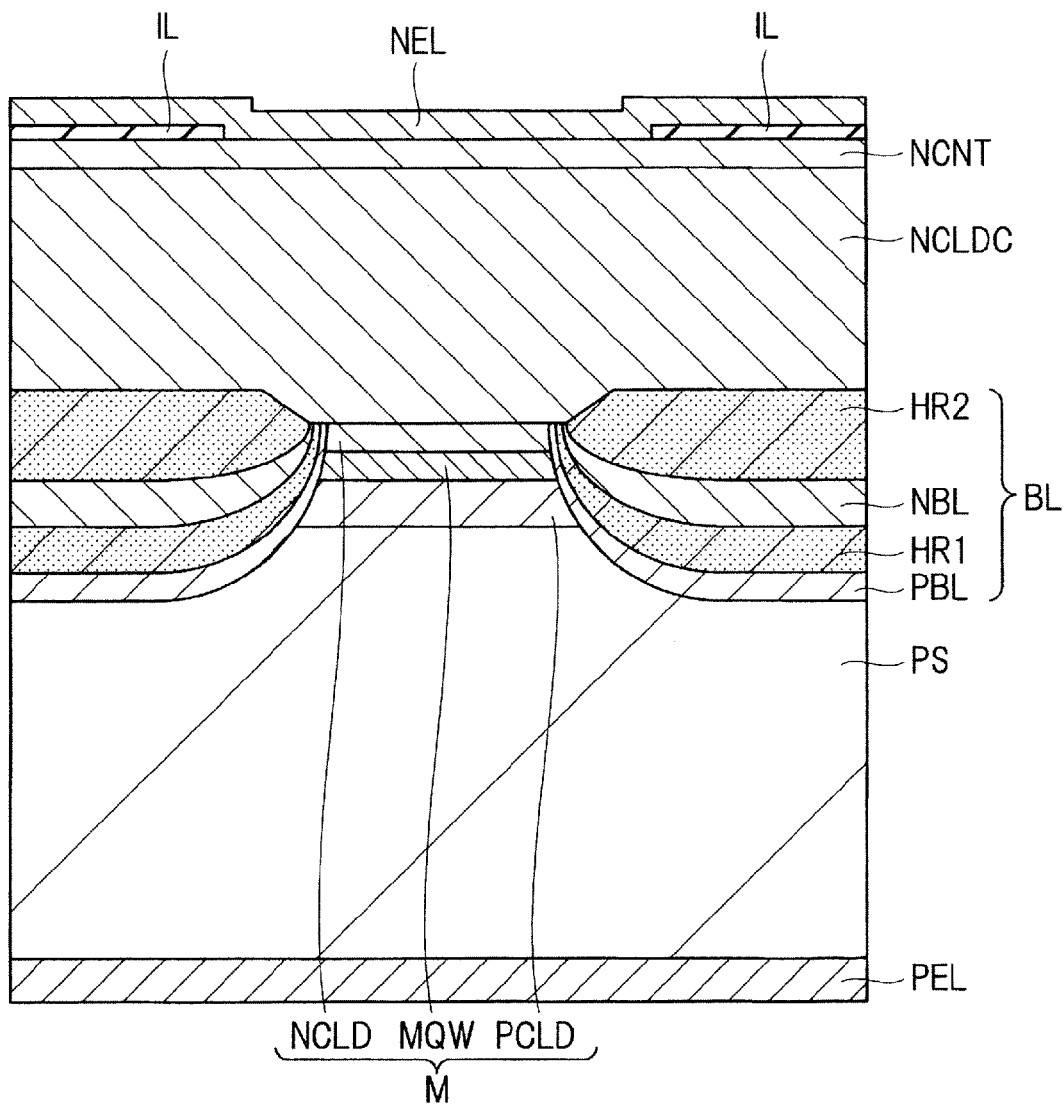
FIG. 1 is a sectional view illustrating a structure of a semiconductor laser according to First Embodiment.

If needed for convenience, the following embodiments will be described by dividing each of them into multiple sections or embodiments; however, the multiple sections or embodiments are not irrelevant to each other, but they are in a relationship in which one is a variation, application example, detailed description, or supplementary description of part or the whole of the others, unless otherwise indicated. When the numbers of elements, etc. (including numbers of pieces, numerical values, amounts, ranges, etc.) are referred to in the following embodiments, the numbers are not limited to the specific ones but may be more or less than the specific numbers, unless otherwise indicated or except when the numbers are obviously limited to the specific numbers in principle.

Further, in the following embodiments, the constituents (also including element steps, etc.) are not necessarily essential, unless otherwise indicated or clearly essential in principle. Similarly, when the shapes and positional relations, etc., of the constituents, etc., are referred to in the following embodiments, those substantially the same or similar to the shapes, etc., should also be included, unless otherwise indicated or except when considered to be clearly otherwise in principle. The same is true with the aforementioned numbers, etc., (including the numbers of pieces, numerical values, amounts, and ranges, etc.).

Hereinafter, preferred embodiments will be described in detail with reference to the accompanying views. In the whole views for explaining the embodiments, members having the same function as each other will be denoted with the same or relevant reference numeral and duplicative description will be omitted. When a plurality of similar members (parts) are present, an individual or specific part may be represented by adding a sign to the collective reference numeral. In the following embodiments, description of the same or similar parts will not be repeated in principle, unless particularly necessary.

In the views used in the embodiments, hatching may be omitted even in sectional views in order to make them easier to see.

In the sectional views, the size of each part does not correspond to that of an actual device, and a specific part may be illustrated to be relatively large in order to make them easier to understand.

First Embodiment

Hereinafter, a semiconductor laser (semiconductor device) according to the present embodiment will be described in detail with reference to the views. FIG. 1 is a sectional view illustrating a structure of the semiconductor laser according to the embodiment.

[Description of Structure]

As illustrated in FIG. 1, the semiconductor laser according to the present embodiment uses a p-type substrate (p-type semiconductor substrate) PS as a substrate, and has a mesa-type semiconductor part (ridge stripe part that is also referred to as a convex part) M formed over the substrate. Specifically, the mesa-type semiconductor part M includes a p-type cladding layer PCLD, an active layer MQW, and an n-type cladding layer NCLD, which are arranged in this order from below. Thus, the semiconductor laser according to the embodiment has a structure in which the active layer MQW is sandwiched by semiconductor layers having conductivity types opposite to each other that are arranged over and below the active layer MQW. The mesa-type semiconductor part is processed into a line shape in the direction intersecting the plane of the paper. The mesa-type semiconductor part M includes a compound semiconductor. The compound semiconductor is a semiconductor including two or more elements, and an example thereof is a semiconductor using, for example, a group III element and a group V element (group III-V semiconductor).

The side surface (sidewall) of the mesa-type semiconductor part is covered with a block layer BL. The block layer BL is arranged over the side surface of the mesa-type semiconductor part M and over the p-type substrate PS. In the block layer BL, a p-type block layer PBL, a high-resistance layer HR1, an n-type block layer NBL, and a high-resistance layer HR2 are arranged in this order from below. Each of the p-type block layer PBL and the n-type block layer NBL includes a compound semiconductor, for example, a group III-V semiconductor. Each of the high-resistance layer HR1 and the high-resistance layer HR2 is a layer having a resistance higher than that of the p-type block layer PBL, and includes a layer formed, for example, by introducing impurities, such as Fe (iron), into a compound semiconductor, such as a group III-V semiconductor.

An n-side electrode NEL is arranged, via an n-type cladding protective layer NCLDC and an n-type contact layer NCNT, over the mesa-type semiconductor part M and the block layer BL located on both the sides of the semiconductor part M; and a p-side electrode PEL is arranged in the rear surface of the p-type substrate PS. The n-side electrode NEL contacts the n-type contact layer NCNT via an opening in an insulating layer IL. In other words, the n-side electrode NEL is coupled to the n-type contact layer NCNT via the opening in the insulating layer IL. The rear surface of the p-type substrate PS is coupled to the p-side electrode PEL. Each of the n-type cladding protective layer NCLDC, the n-type contact layer NCNT, and the p-type substrate PS includes a compound semiconductor, for example, a group III-V semiconductor.

Herein, the high-resistance layer HR1 is provided between the p-type block layer PBL and the n-type block layer NBL that form the block layer BL in the semiconductor laser according to the present embodiment, and hence a semiconductor laser having a low capacitance can be achieved. Further, a threshold value can be lowered. Furthermore, the manufacturing yield of the semiconductor lasers can be improved. The capacitance resulting from the p-n junction between the p-type block layer PBL and the n-type block layer NBL in the block layer BL can be reduced. Thereby, a high speed modulation characteristic is improved.

Subsequently, the operations of the semiconductor laser will be briefly described.

First, a positive voltage is applied to the p-side electrode PEL and a negative voltage to the n-side electrode NEL. Thereby, a forward current flows from the p-side electrode PEL toward the n-side electrode NEL, and a hole is injected into the active layer MQW from the p-side electrode PEL. On the other hand, an electron is injected into the active layer MQW from the n-side electrode NEL.

In the active layer MQW, inverted population is formed by the injected hole and electron, and with the electron making transition from a conduction band to a valence band by induced emission, light whose phases are aligned is generated. The light generated in the active layer MQW is confined within the active layer MQW by the surrounding semiconductor layers each having a refractive index lower than that of the active layer MQW (the p-type cladding layer PCLD and the n-type cladding layer NCLD). Additionally, the light confined within the active layer MQW reciprocates around a resonator including a cleavage surface (laser end surface) formed in the semiconductor laser, and hence the light is amplified by further induced emission. Thereafter, laser beams oscillate within the active layer MQW, so that a laser beam is emitted. At the time, a laser beam is emitted from the active layer MQW in the mesa-type semiconductor part M.

Hereinafter, a structure of the semiconductor laser according to the present embodiment will be described in detail.

As the p-type substrate PS, a substrate including, for example, indium phosphide (InP) into which p-type impurities have been introduced is used. As the p-type impurities, for example, magnesium (Mg) is used.

As the p-type cladding layer PCLD, for example, an indium phosphide layer into which p-type impurities have been introduced (p-type InP layer) is used.

As the active layer MQW, for example, an aluminum-gallium-indium-arsenide layer (AlGaInAs layer) is used. Specifically, an active layer of a multi-quantum well structure based on aluminum-gallium-indium-arsenic is used as the active layer MQW. That is, a laminated body, in which quantum well layers each including an AlGaInAs layer and barrier layers each including an AlGaInAs layer have been alternately laminated, is used as the active layer MQW. Herein, the indium composition of the AlGaInAs layer that forms the quantum well layer is different from that of the AlGaInAs layer that forms the barrier layer. The indium composition ratio and the thickness of each of these layers are adjusted in accordance with desired laser characteristics.

As the n-type cladding layer NCLD, for example, an indium phosphide layer into which n-type impurities have been introduced (n-type InP layer) is used.

As the p-type block layer PBL that forms the block layer BL, for example, an indium phosphide layer into which p-type impurities have been introduced (p-type InP layer) is used.

As the high-resistance layer HR1 that forms the block layer BL, for example, an indium phosphide layer into which Fe (iron) has been introduced (Fe-doped InP layer) is used.

As the n-type block layer NBL that forms the block layer BL, for example, an indium phosphide layer into which n-type impurities have been introduced (n-type InP layer) is used.

As the high-resistance layer HR2 that forms the block layer BL, for example, an indium phosphide layer into which Fe (iron) has been introduced (Fe-doped InP layer) is used.

As the n-type cladding protective layer NCLDC, for example, an indium phosphide layer into which n-type impurities have been introduced (n-type InP layer) is used.

As the n-type contact layer NCNT, an indium phosphide layer into which n-type impurities have been introduced (n-type InP layer) is used.

Herein, the bandgap of the active layer MQW is smaller than that of the n-type cladding layer NCLD. Additionally, the bandgap of the active layer MQW is smaller than that of the p-type cladding layer PCLD. More specifically, a laminated part of n-type semiconductors is provided over the active layer MQW, and the bandgap of the active layer MQW is smaller than that of each of the layers that form the laminated part of the n-type semiconductors. Additionally, a laminated part of p-type semiconductors is provided below the active layer MQW, and the bandgap of the active layer MQW is smaller than that of each of the layers that form the laminated part of the p-type semiconductors. Additionally, the refractive index of each of the laminated part of the n-type semiconductors and the laminated part of the p-type semiconductors is lower than that of the active layer MQW.

The block layer BL includes the semiconductors and the high-resistance layers, and the bandgap thereof is larger than that of any of the active layer MQW, the n-type cladding layer NCLD, and the p-type cladding layer PCLD.

As the insulating layer IL over the n-type cladding protective layer NCLDC, for example, a silicon oxide film is used.

As the p-side electrode PEL, for example, a laminated film of palladium (Pd) and platinum (Pt) is used. As the n-side electrode NEL, for example, a laminated film of titanium (Ti) and gold (Au) is used.

[Description of Manufacturing Method]

Subsequently, a manufacturing method of the semiconductor laser according to the present embodiment will be described and the structure of the semiconductor laser will be made clearer, with reference to FIGS. 2 to 6. FIGS. 2 to 6 are sectional views each illustrating a manufacturing step of the semiconductor laser according to the embodiment.

Figure 2:
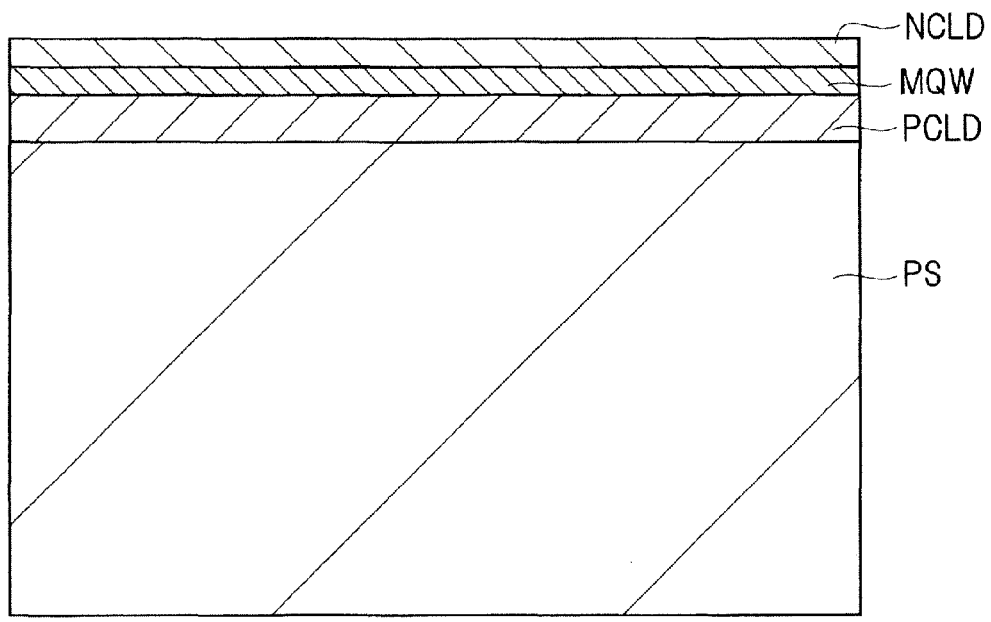
FIG. 2 is a sectional view illustrating a manufacturing step of the semiconductor laser according to First Embodiment.

As illustrated in FIG. 2, a substrate including, for example, indium phosphide into which p-type impurities have been introduced is provided as the p-type substrate PS, and a p-type InP layer is grown over the substrate PS as the p-type cladding layer PCLD by using, for example, a MOVPE (Metal Organic Vapor Phase Epitaxy) method. For example, the layer is grown while carrier gas and raw material gas are being introduced into an apparatus. As the carrier gas, hydrogen, nitrogen, or mixed gas thereof is used. As the raw material gas, gas containing a constituent element of the p-type cladding layer PCLD is used. In forming the p-type InP layer, trimethyl indium (TMIn) and phosphine ($PH_3$) are used as raw materials for In and P, respectively, and dimethyl zinc (DMZn) is used as a raw material for p-type impurities.

Subsequently, an AlGaInAs layer is grown over the p-type cladding layer PCLD as the active layer MQW by using, for example, an MOVPE method. The active layer MQW (multi-quantum well structure body in which the AlGaInAs well layer and the AlGaInAs barrier layer, each of which has an indium composition different from that of the other, are alternately laminated) is crystal-growth, for example, by changing raw material gas. In forming the active layer MQW (AlGaInAs layer), trimethyl aluminum (TMAl), trimethylgallium (TMGa), trimethylindium (TMIn), and arsine (AsH$_3$) are used as raw materials for Al, Ga, In, and As, respectively. The AlGaInAs well layer and the AlGaInAs barrier layer, each of which has an indium composition different from that of the other, can be alternately laminated by changing the flow rate of trimethylindium (TMIn) that is a raw material for In.

Subsequently, an n-type InP layer is grown over the active layer MQW as the n-type cladding layer NCLD by using, for example, an MOVPE method. The n-type cladding layer NCLD is crystal-grown, for example, by changing raw material gas. The layer is grown while carrier gas and raw material gas are being introduced into an apparatus. In forming the n-type InP layer, trimethylindium (TMIn) and phosphine (PH$_3$) are used as raw materials for In and P, respectively, and disilane (Si$_2$H$_6$) is used as a raw material for n-type impurities.

Figure 3:
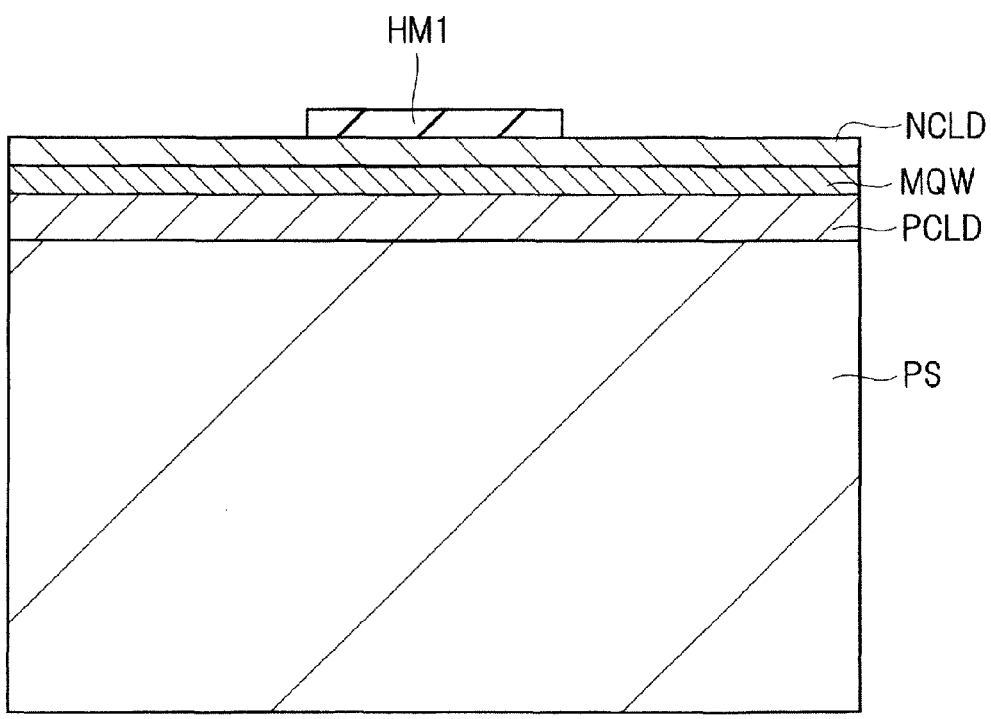
FIG. 3 is a sectional view illustrating a manufacturing step of the semiconductor laser according to First Embodiment, which follows the manufacturing step of FIG. 2.
Figure 4:
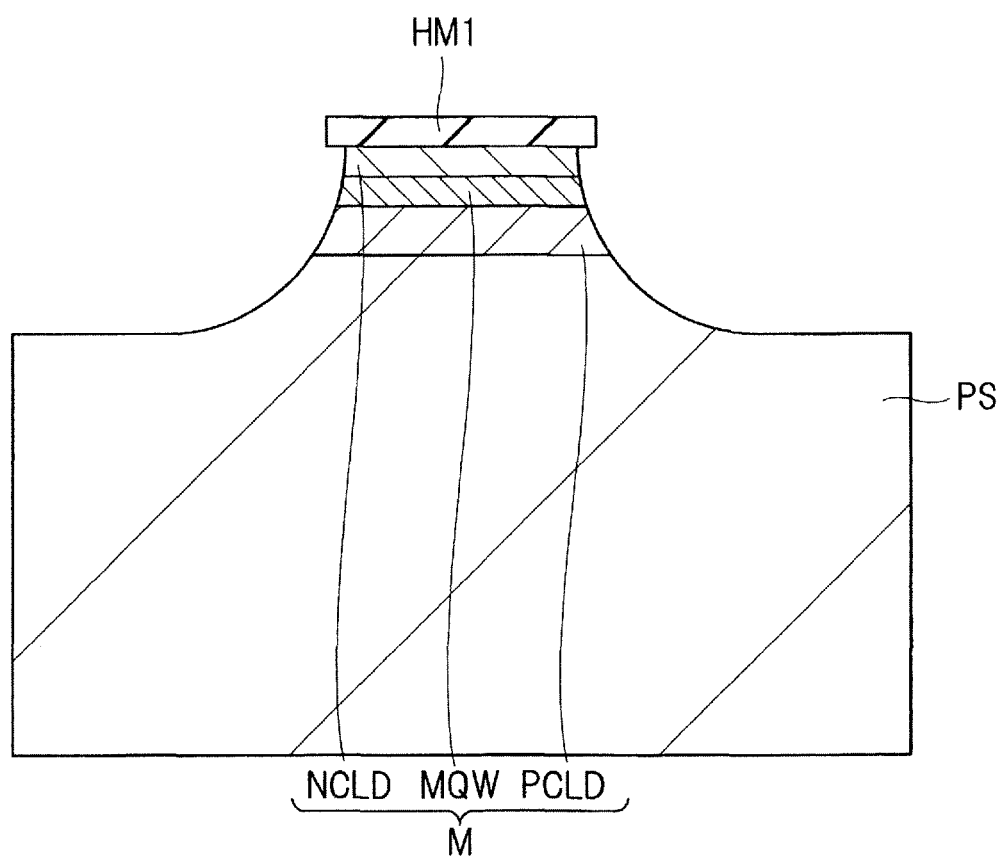
FIG. 4 is a sectional view illustrating a manufacturing step of the semiconductor laser according to First Embodiment, which follows the manufacturing step of FIG. 3.

Subsequently, the mesa-type semiconductor part M is formed by patterning the laminated part of the p-type cladding layer PCLD, the active layer MQW, and the n-type cladding layer NCLD, as illustrated in FIGS. 3 and 4.

For example, a hard mask HM1 is formed over the n-type cladding layer NCLD, as illustrated in FIG. 3. A silicon oxide (SiO$_2$) film is formed over the n-type cladding layer NCLD by using, for example, a CVD (Chemical Vapor Deposition) method, or the like. Subsequently, a photoresist film (not illustrated) is coated over the hard mask HM1 (silicon oxide film), and thereafter the photoresist film is caused to remain only in a region where the mesa-type semiconductor part M is caused to remain, by using a photolithography technique. Subsequently, the hard mask HM1 (silicon oxide film) is etched by using the photoresist film as a mask. Subsequently, the photoresist film is removed by asking, or the like.

Subsequently, the laminated part of the p-type cladding layer PCLD, the active layer MQW, and the n-type cladding layer NCLD is etched by using the hard mask HM1 (silicon oxide film) as a mask, as illustrated in FIG. 4. Herein, a certain depth from the surface of the p-type substrate PS may be etched.

Thereby, the mesa-type semiconductor part M can be formed. Additionally, the p-type substrate PS is exposed on both the sides of the mesa-type semiconductor part M. In other words, a trench is formed on both the sides of the mesa-type semiconductor part M, and the p-type substrate PS is exposed from the bottom of the trench.

Figure 5:
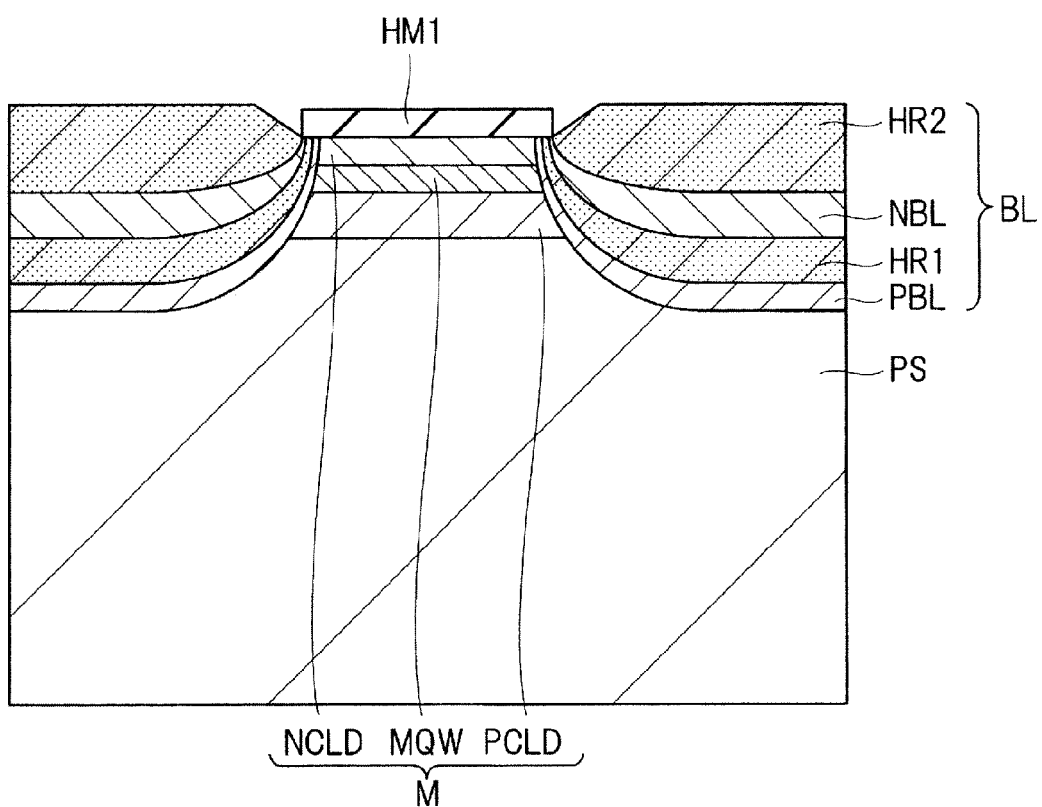
FIG. 5 is a sectional view illustrating a manufacturing step of the semiconductor laser according to First Embodiment, which follows the manufacturing step of FIG. 4.

Subsequently, the block layer BL is formed over the p-type substrate PS on both the sides of the mesa-type semiconductor part M, as illustrated in FIG. 5.

The p-type block layer PBL is first formed over the side surface of the mesa-type semiconductor part M and over the p-type substrate PS. For example, a p-type InP layer is grown to have a thickness of approximately 0.1 over the side surface of the mesa-type semiconductor part M and over the p-type substrate PS as the p-type block layer PBL by using, for example, an MOVPE method. The layer is grown, for example, while carrier gas and raw material gas are being introduced into an apparatus, similarly to the case of the p-type InP layer that forms the p-type cladding layer PCLD. Trimethyl indium (TMIn) and phosphine (PH$_3$) are used as raw materials for In and P, respectively, and dimethyl zinc (DMZn) is used as a raw material for p-type impurities.

Subsequently, the high-resistance layer HR1 is formed over the p-type block layer PBL. In other words, the high-resistance layer HR1 is formed over the side surface of the mesa-type semiconductor part M and over the p-type substrate PS via the p-type block layer PBL. For example, an indium phosphide layer into which Fe (iron) has been introduced (Fe-doped InP layer) is grown to have a thickness of approximately 0.3 μm, over the p-type block layer PBL as the high-resistance layer HR1 by using, for example, an MOVPE method. The high-resistance layer HR1 is crystal-grown, for example, by changing raw material gas. In forming the Fe-doped InP layer, trimethylindium (TMIn) and phosphine (PH$_3$) are used as raw materials for In and P, respectively, and ferrocene (Cp$_2$Fe) is used as a raw material for Fe.

Subsequently, the n-type block layer NBL is formed over the high-resistance layer HR1. In other words, the n-type block layer NBL is formed over the side surface of the mesa-type semiconductor part M and over the p-type substrate PS via the p-type block layer PBL and the high-resistance layer HR1. For example, an n-type InP layer is grown over the high-resistance layer HR1 as the n-type block layer NBL by using, for example, an MOVPE method. The n-type block layer NBL is crystal-grown, for example, by changing raw material gas. In forming the n-type InP layer, trimethylindium (TMIn) and phosphine (PH$_3$) are used as raw materials for In and P, respectively, and disilane (Si$_2$H$_6$) is used as a raw material for n-type impurities.

Subsequently, the high-resistance layer HR2 is formed over the n-type block layer NBL. In other words, the high-resistance layer HR2 is formed over the side surface of the mesa-type semiconductor part M and over the p-type substrate PS via the p-type block layer PBL, the high-resistance layer HR1, and the n-type block layer NBL. For example, an indium phosphide layer into which Fe (iron) has been introduced (Fe-doped InP layer) is grown to have a thickness of approximately 0.5 μm, over the n-type block layer NBL as the high-resistance layer HR2 by using, for example, an MOVPE method. The high-resistance layer HR2 is crystal-grown, for example, by changing raw material gas. In forming the Fe-doped InP layer, trimethylindium (TMIn) and phosphine (PH$_3$) are used as raw materials for In and P, respectively, and ferrocene (Cp$_2$Fe) is used as a raw material for Fe.

Thereby, the block layer BL can be formed over the p-type substrate PS on both the sides of the mesa-type semiconductor part M. In other words, the block layer BL, covering the side surface of the mesa-type semiconductor part M and the p-type substrate PS exposed on both the sides thereof, can be formed. Herein, each of the layers that form the block layer BL is not grown over the hard mask HM1.

Figure 6:
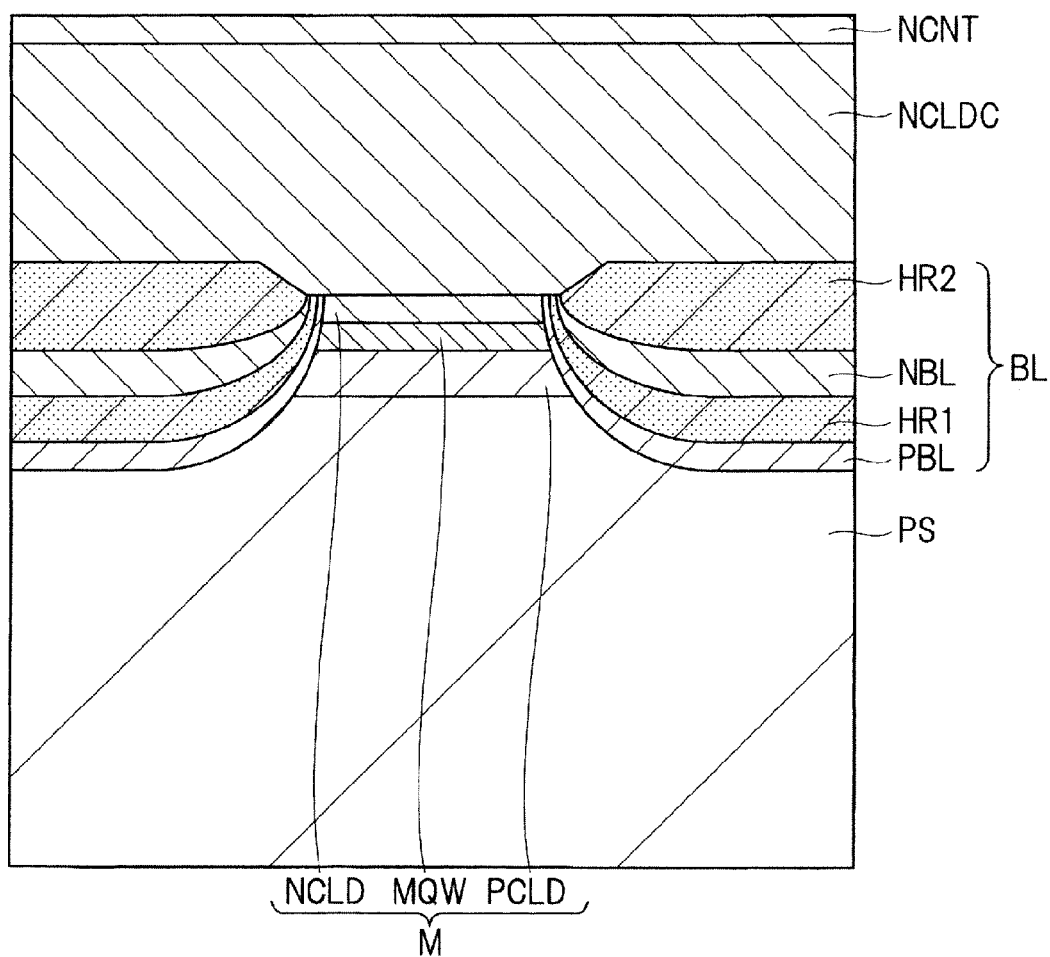
FIG. 6 is a sectional view illustrating a manufacturing step of the semiconductor laser according to First Embodiment, which follows the manufacturing step of FIG. 5.

Subsequently, the n-type cladding protective layer NCLDC is formed over the mesa-type semiconductor part M and over the block layer BL on both the sides thereof, and the n-type contact layer NCNT is further formed over the protective layer NCLDC, as illustrated in FIG. 6.

The hard mask HM1 over the mesa-type semiconductor part M is first removed by etching. Thereby, the n-type cladding layer NCLD is exposed. The high-resistance layer HR2 is exposed on both the sides of the n-type cladding layer NCLD.

The n-type cladding protective layer NCLDC is formed over the n-type cladding layer NCLD and over the high-resistance layer HR2. For example, an n-type InP layer is grown over the n-type cladding layer NCLD and over the high-resistance layer HR2 as the n-type cladding protective layer NCLDC by using, for example, an MOVPE method. The layer is grown, for example, while carrier gas and raw material gas are being introduced into an apparatus, similarly to the case of the n-type InP layer that forms the n-type cladding layer NCLD. Trimethylindium (TMIn) and phosphine (PH$_3$) are used as raw materials for In and P, respectively, and disilane (Si$_2$H$_6$) is used as a raw material for n-type impurities.

By thus using the p-type substrate PS as a substrate, an n-type semiconductor layer can be used as the cladding protective layer NCLDC covering over the mesa-type semiconductor part M, thereby allowing an element resistance to be further reduced, as compared to the case where a p-type semiconductor layer is used as a cladding protective layer covering over the mesa-type semiconductor part M by using an n-type substrate.

Subsequently, the n-type contact layer NCNT is formed over the n-type cladding protective layer NCLDC. For example, an n-type InP layer is grown over the n-type cladding protective layer NCLDC as the n-type contact layer NCNT by using, for example, an MOVPE method. An n-type InP layer, having an n-type impurity concentration higher than that of the n-type cladding protective layer NCLDC, is grown as the n-type contact layer NCNT, for example, by changing, of the raw material gas, the flow rate of the raw material gas for the n-type impurities.

Subsequently, a silicon oxide film is formed over the n-type contact layer NCNT as the insulating layer IL by using, for example, a CVD method, or the like, as illustrated in FIG. 1. Subsequently, the insulating layer IL above the mesa-type semiconductor part M is removed. The insulating layer IL is etched by using, for example, a photoresist film (not illustrated), having an opening in a region where the mesa-type semiconductor part M is to be formed, as a mask. Subsequently, the photoresist film is removed by asking, or the like.

Subsequently, the n-side electrode NEL is formed over the insulating layer IL and the n-type contact layer NCNT exposed from the opening in the insulating layer IL. For example, a titanium (Ti) film and a gold (Au) film are sequentially formed over the insulating layer IL and the opening in the insulating layer IL by a vapor deposition method, or the like. Subsequently, the n-side electrode NEL is formed by alloying these metals with a heat treatment.

Subsequently, the thickness of the p-type substrate PS is made small by turning the substrate PS upside down so as to grind the rear surface of the substrate PS. Subsequently, for example, a palladium (Pd) film and a platinum (Pt) film are sequentially formed in the rear surface of the p-type substrate PS by using a vapor deposition method, or the like. Subsequently, a laminated film of the palladium (Pd) film and the platinum (Pt) film is patterned, if necessary, and thereafter these metals are alloyed by subjecting to a heat treatment. Thereby, the p-side electrode PEL is formed.

Subsequently, from the p-type substrate PS in a wafer state having a plurality of chip regions, every chip region is cut out. The space between the chip regions is first cleaved. That is, the space between a chip region and the adjacent chip region is cleaved, for example, in a first direction. Thereby, the aforementioned cleaved surface is formed. A chip piece is cut out by further cutting the p-type substrate PS along a second direction intersecting the first direction.

The semiconductor laser according to the present embodiment can be formed by the aforementioned steps.

In the semiconductor laser according to the present embodiment, the high-resistance layer HR1 is provided between the p-type block layer PBL and the n-type block layer NBL that form the block layer BL, thereby allowing a threshold value to be lowered. Further, the manufacturing yield of the semiconductor lasers can be improved. Furthermore, the capacitance resulting from the p-n junction between the p-type block layer PBL and the n-type block layer NBL in the block layer BL can be reduced. Thereby, a high speed modulation characteristic is improved.

Figure 7:
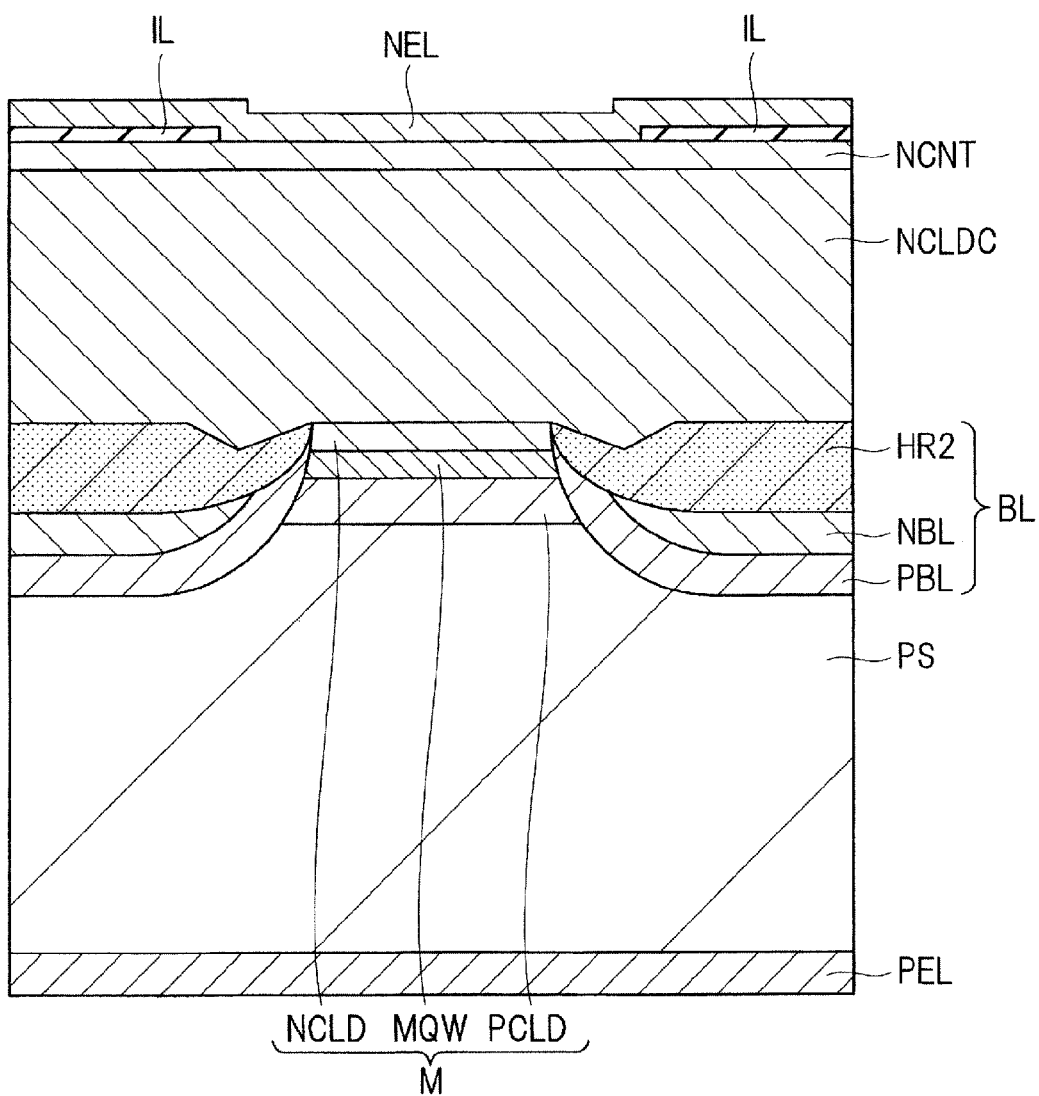
FIG. 7 is a sectional view illustrating a structure of a semiconductor laser of a comparative example.

FIG. 7 is a sectional view illustrating a structure of a semiconductor laser of a comparative example. In FIG. 7, the block layer BL has a structure in which the p-type block layer PBL, the n-type block layer NBL, and the high-resistance layer HR2 are arranged in this order from below. Herein, a member having the same function as that in the semiconductor laser illustrated in FIG. 1 will be denoted with the same symbol and the description thereof will be omitted.

Figure 8:
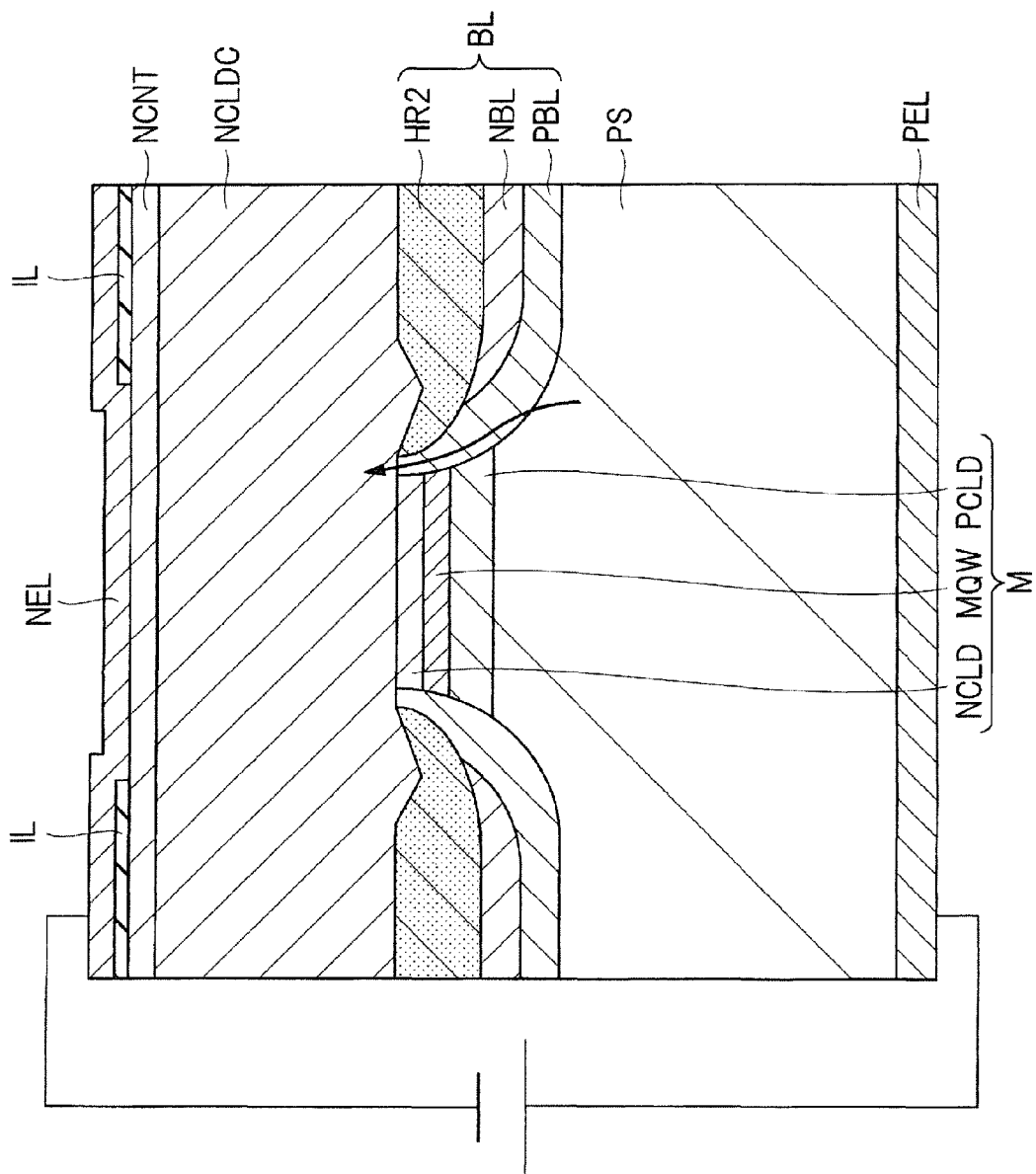
FIG. 8 is a sectional view illustrating a pathway of a leakage current in the semiconductor laser of the comparative example.
Figure 9:
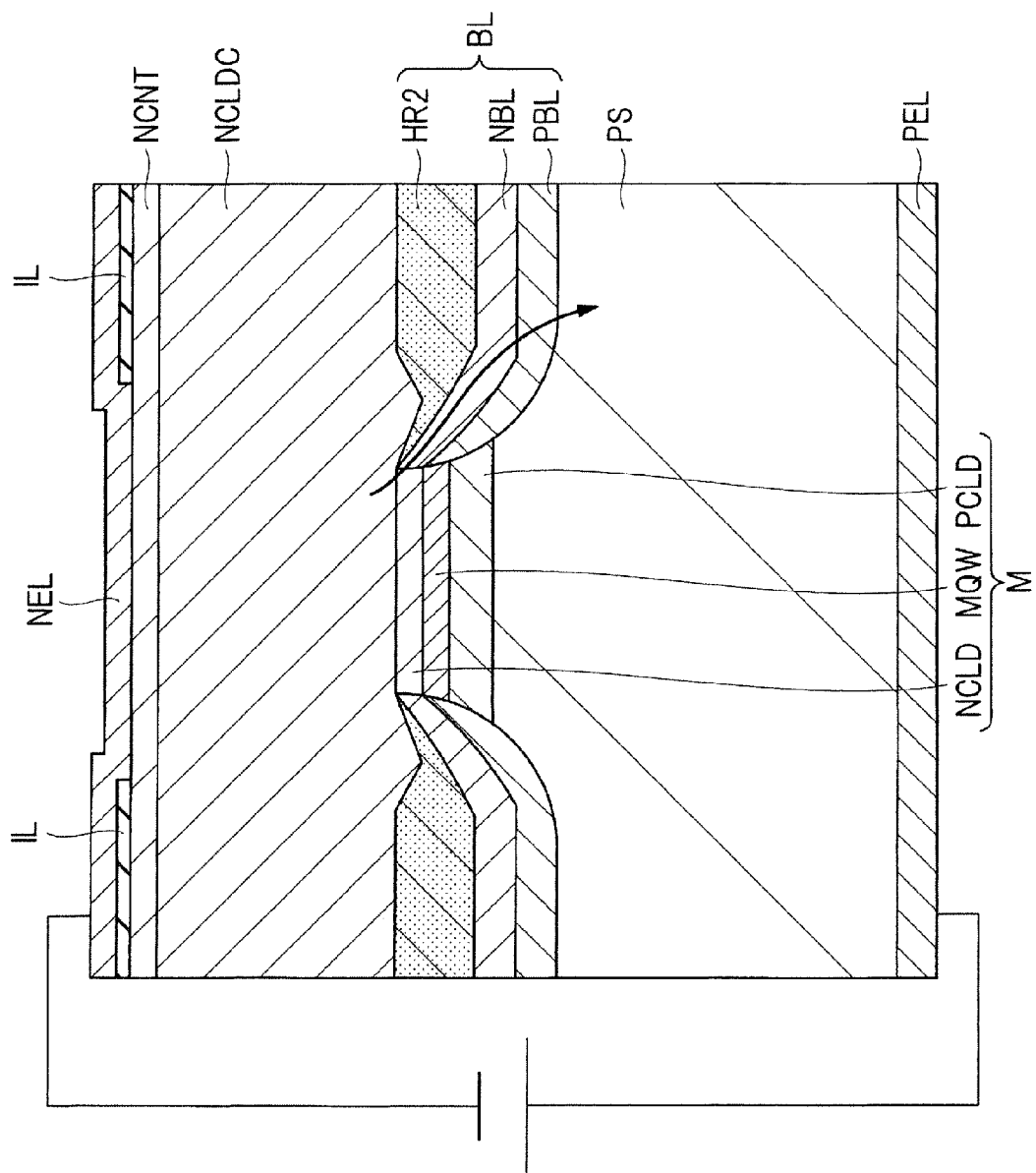
FIG. 9 is a sectional view illustrating a pathway of a leakage current in the semiconductor laser of the comparative example.

FIGS. 8 and 9 are sectional views each illustrating a pathway of a leakage current in the semiconductor laser of the comparative example. When the thickness of the p-type block layer PBL is large in the semiconductor laser of the comparative example, as illustrated in FIG. 8, a hole flows along the side surface of the active layer MQW from the side of the p-side electrode PEL (see the arrow), so that the hole is annihilated by being combined with an electron in the n-type cladding layer NCLD or the n-type cladding protective layer NCLDC. In other words, a leakage current occurs. Alternatively, when the thickness of the p-type block layer PBL is made small in the semiconductor laser of the comparative example, as illustrated in FIG. 9, the n-type cladding layer NCLD over the active layer MQW and the n-type block layer NBL contact each other, or the space between them becomes small. In such a case, an electron flows from the side of the n-side electrode NEL to the n-type block layer NBL (see the arrow), so that the electron is annihilated by being combined with a hole in the p-type block layer PBL. In other words, a leakage current occurs.

Figure 10:
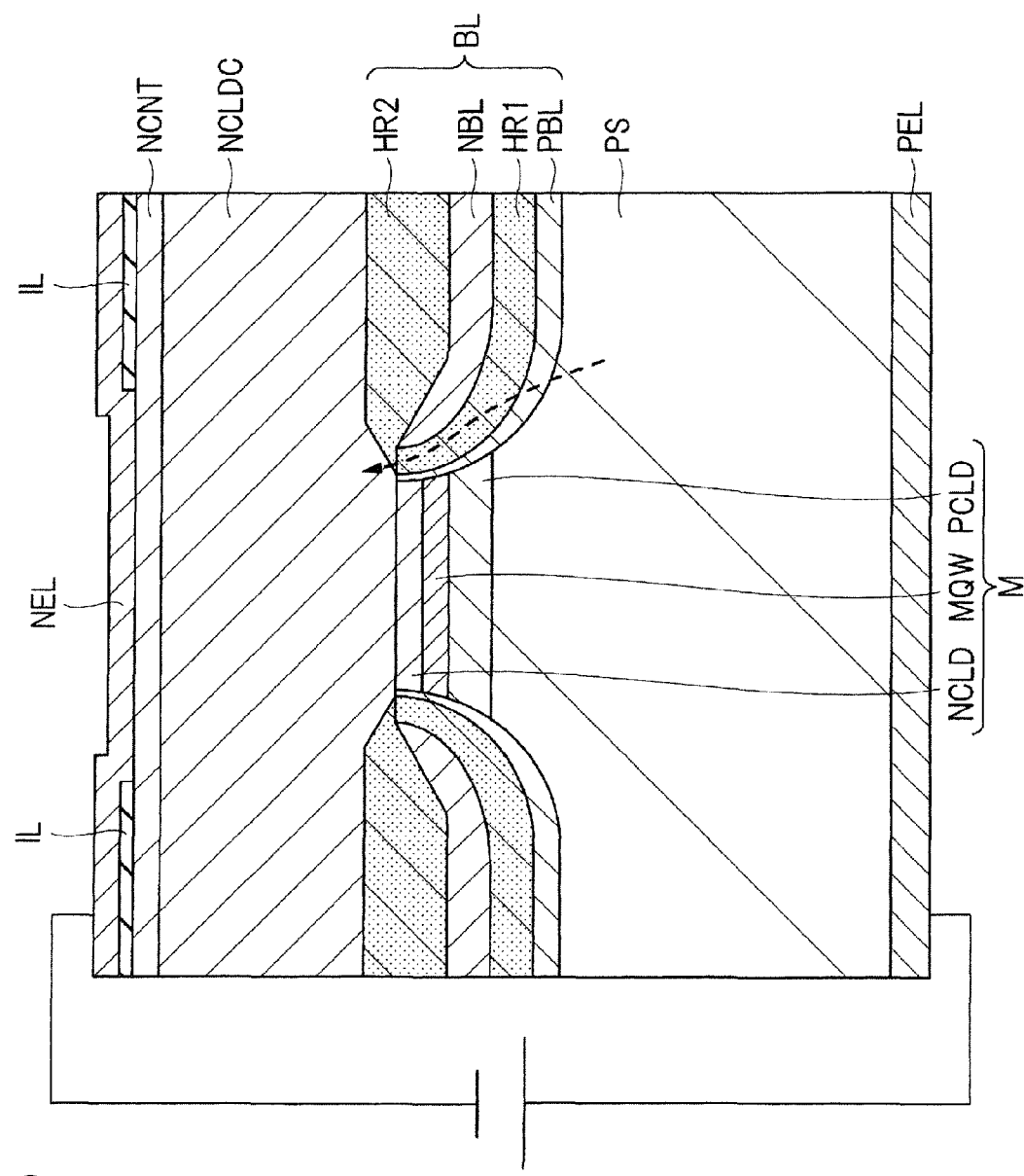
FIG. 10 is a sectional view illustrating a pathway of a leakage current in the semiconductor laser according to First Embodiment.
Figure 11:
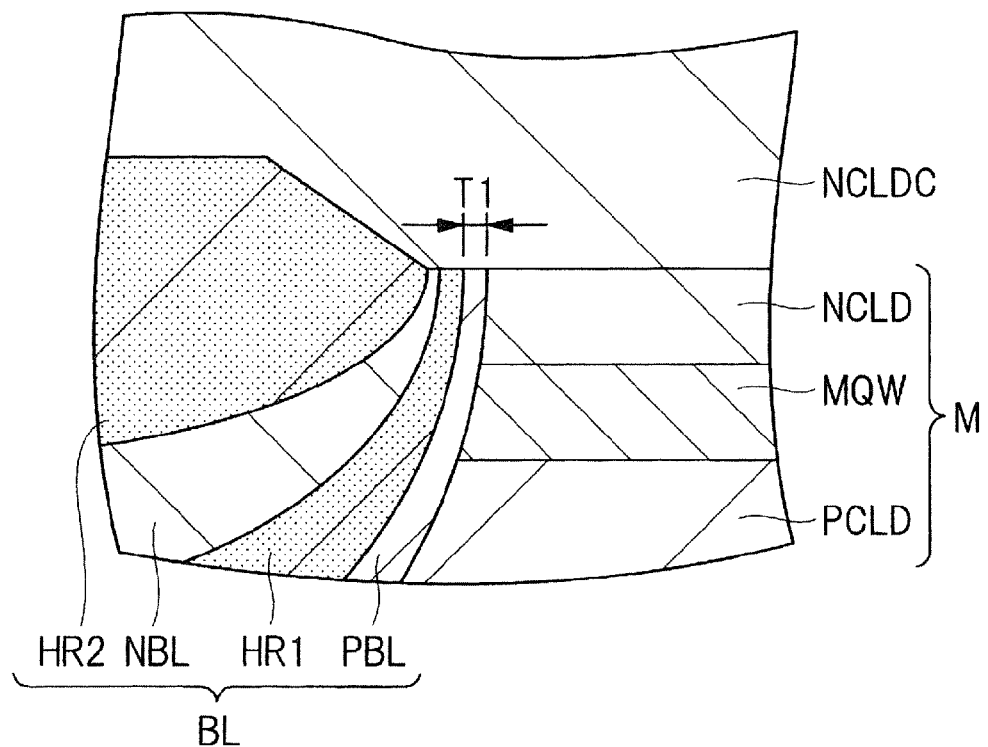
FIG. 11 is an enlarged schematic view of the vicinity of the boundary portion between a mesa-type semiconductor part and a block layer in the semiconductor laser according to First Embodiment.

FIG. 10 is a sectional view illustrating a pathway of a leakage current in the semiconductor laser according to the present embodiment. FIG. 11 is an enlarged schematic view of the vicinity of the boundary portion between the mesa-type semiconductor part and the block layer in the semiconductor laser according to the embodiment. In the side surface (side) of the mesa-type semiconductor part M, the p-type block layer PBL and the high-resistance layer HR1 are arranged between the n-type cladding layer NCLD over the active layer MQW and the n-type block layer NBL. The thickness of the upper end portion of the p-type block layer PBL is T1 (see FIG. 11).

Contrary to the comparative example, in the semiconductor laser according to the present embodiment, the high-resistance layer HR1 is provided between the p-type block layer PBL and the n-type block layer NBL that form the block layer BL, as illustrated in FIGS. 10 and 11, and hence the thickness of the p-type block layer PBL can be controlled not to become large and a leakage current (flow of a hole) can be reduced. Further, the distance between the n-type cladding layer NCLD and the n-type block layer NBL can be secured, and hence a leakage current (flow of an electron) can be prevented. Thus, the aforementioned leakage current can be controlled and the threshold value of the semiconductor laser can be lowered. Further, the characteristics of the semiconductor laser and the manufacturing yield of the semiconductor lasers can be improved.

Furthermore, a semiconductor laser having a low capacitance can be achieved by providing the high-resistance layer HR1 between the p-type block layer PBL and the n-type block layer NBL that form the block layer BL. Thereby, a high speed modulation characteristic can be improved.

Figure 12:
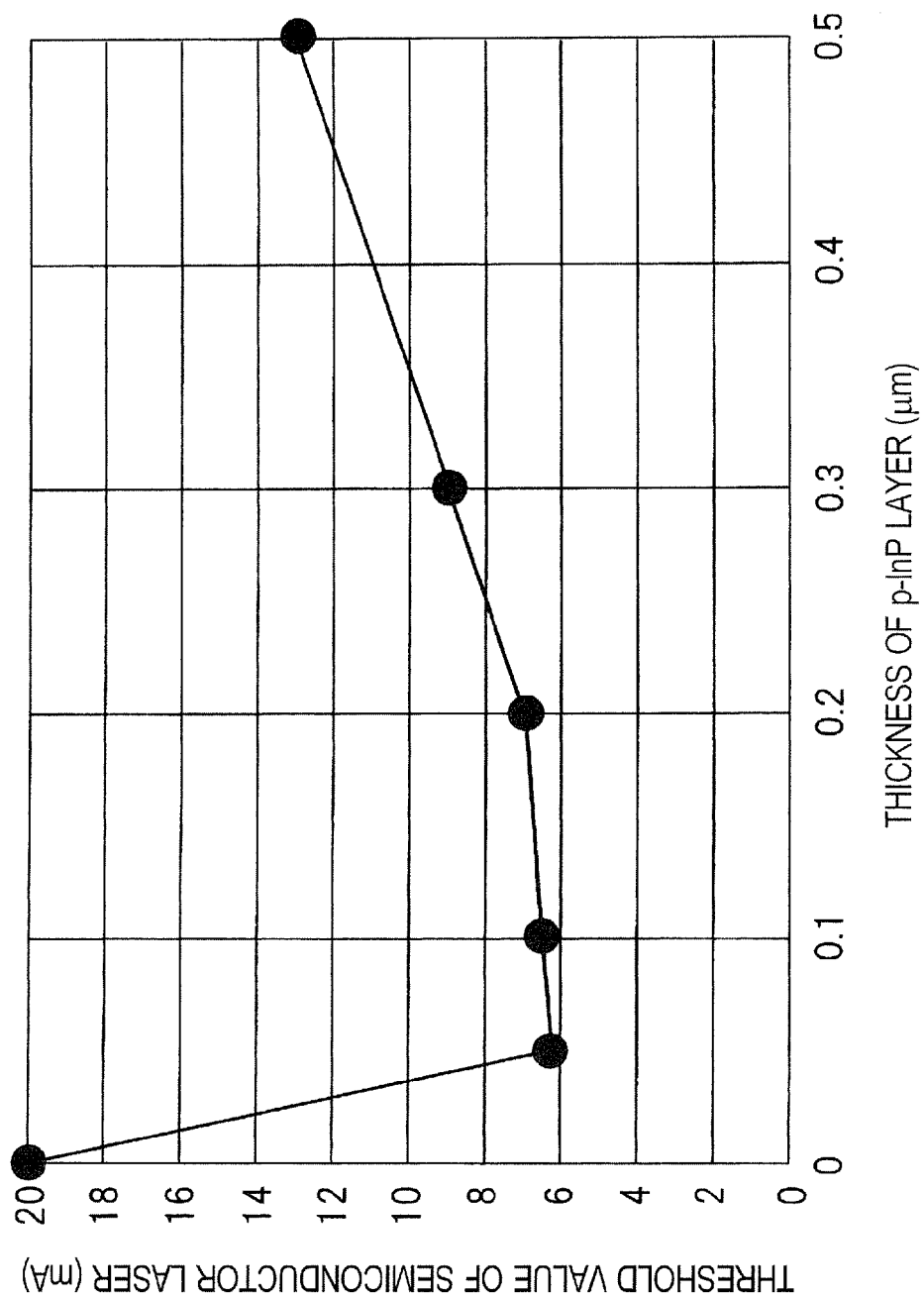
FIG. 12 is a graph showing the relationship between the thickness of a p-type block layer and the threshold value of a semiconductor laser.

FIG. 12 is a graph showing the relationship between the thickness of the p-type block layer and the threshold value of the semiconductor laser. The horizontal axis represents the thickness of the p-type block layer (thickness of the p-type InP layer, um), while the vertical axis represents the threshold value of the semiconductor laser (mA). The current-optical output characteristic of a semiconductor laser in which an element length is 200 µm and both end surfaces are in a cleaved state is measured such that threshold values are calculated.

When the thickness of the p-type block layer (p-type InP layer) PBL is 0 µm, i.e., when the n-type block layer (n-type InP layer) NBL and the n-type cladding layer (n-type InP layer) NCLD contact each other, a leakage current becomes maximum and a threshold value is sharply increased. This is because: a leakage current becomes large due to the electron flowing from the n-type cladding layer (n-type InP layer) NCLD through the n-type block layer (n-type InP layer) NBL; and a threshold value is sharply increased. In particular, the mobility of an electron is larger than that of a hole, and hence a leakage current becomes large (see the aforementioned FIG. 9).

On the other hand, when the p-type block layer (p-type InP layer) PBL is inserted between the n-type block layer (n-type InP layer) NBL and the n-type cladding layer (n-type InP layer) NCLD, a threshold value is lowered. However, when the thickness of the p-type block layer (p-type InP layer) PBL is made too large, a threshold value is increased. This is because the leakage current flowing via the p-type block layer (p-type InP layer) PBL over the side surface of the mesa-type semiconductor part M is increased (see the aforementioned FIG. 8).

A threshold value is thus increased when the thickness of the p-type block layer (p-type InP layer) PBL is more than 0.2 µm, and hence the thickness of the p-type block layer (p-type InP layer) PBL is preferably 0.2 µm or less, and more preferably 0.1 µm or less. Herein, the thickness of the p-type block layer (p-type InP layer) PBL means the thickness of the upper end portion of the p-type block layer (p-type InP layer) PBL (see Ti in FIG. 11). That is, it means the thickness of the p-type block layer (p-type InP layer) PBL that contacts the n-type cladding layer (n-type InP layer) NCLD.

On the other hand, the distance between the n-type block layer (n-type InP layer) NBL and the n-type cladding layer (n-type InP layer) NCLD can be made large by providing the high-resistance layer (Fe-doped InP layer) between them, and hence a leakage current between them can be controlled. The thickness of the high-resistance layer (Fe-doped InP layer) HR1 is preferably such that the n-type block layer (n-type InP layer) NBL and the n-type cladding layer (n-type InP layer) NCLD are electrically separated from each other, and it is preferable that the thickness thereof is made, for example, 0.3 µm or more. When the thickness of the high-resistance layer (Fe-doped InP layer) HR1 is made 0.3 µm or more, a thickness of 0.3±0.09 µm can be secured even if the variation of the thickness is approximately 30% in the plane of the substrate, and hence the n-type block layer (n-type InP layer) NBL and the n-type cladding layer (n-type InP layer) NCLD can be sufficiently separated from each other. A hole is less likely to flow through the high-resistance layer (Fe-doped InP layer) HR1 than through the p-type block layer (p-type InP layer) PBL, and hence a leakage current flowing via the high-resistance layer (Fe-doped InP layer) HR1 over the side surface of the mesa-type semiconductor part M is controlled.

A semiconductor laser was manufactured according to the steps described in the above "Description of Manufacturing Method", so that it was evaluated. After a substrate (wafer) having a bar shape was cut out from a 2-inch substrate, 30% coating was performed on one end surface, while 95% coating on the other end surface. Thereafter, chip pieces were cut out. Chip pieces located in the inside of the substrate, except 5 mm of the outer peripheral portion of the substrate, were subjected to sampling inspection. A chip piece having a threshold value of 7 mA or less was evaluated as a good product. Good products were obtained at a ratio of 98% in the present embodiment. On the other hand, a semiconductor laser of a comparative example in which the high-resistance layer (Fe-doped InP layer) HR1 had not been inserted was similarly evaluated. In the case of the semiconductor laser of the comparative example, threshold values were increased in some chip pieces, and good products were obtained at a ratio of approximately 60%.

Thus, a reduction in the threshold value and an improvement in the manufacturing yield were able to be confirmed in the semiconductor laser according to the present embodiment in which the high-resistance layer HR1 was provided between the p-type block layer PBL and the n-type block layer NBL that form the block layer BL.

Second Embodiment

The mesa-type semiconductor part M is formed by growing the p-type cladding layer PCLD, the active layer MQW, and the n-type cladding layer NCLD over the whole surface of the p-type substrate PS and then by patterning the laminated part thereof in First Embodiment; however, the mesa-type semiconductor part M may be formed by growing the p-type cladding layer PCLD, the active layer MQW, and the n-type cladding layer NCLD in a partial region over the p-type substrate PS.

Figure 13:
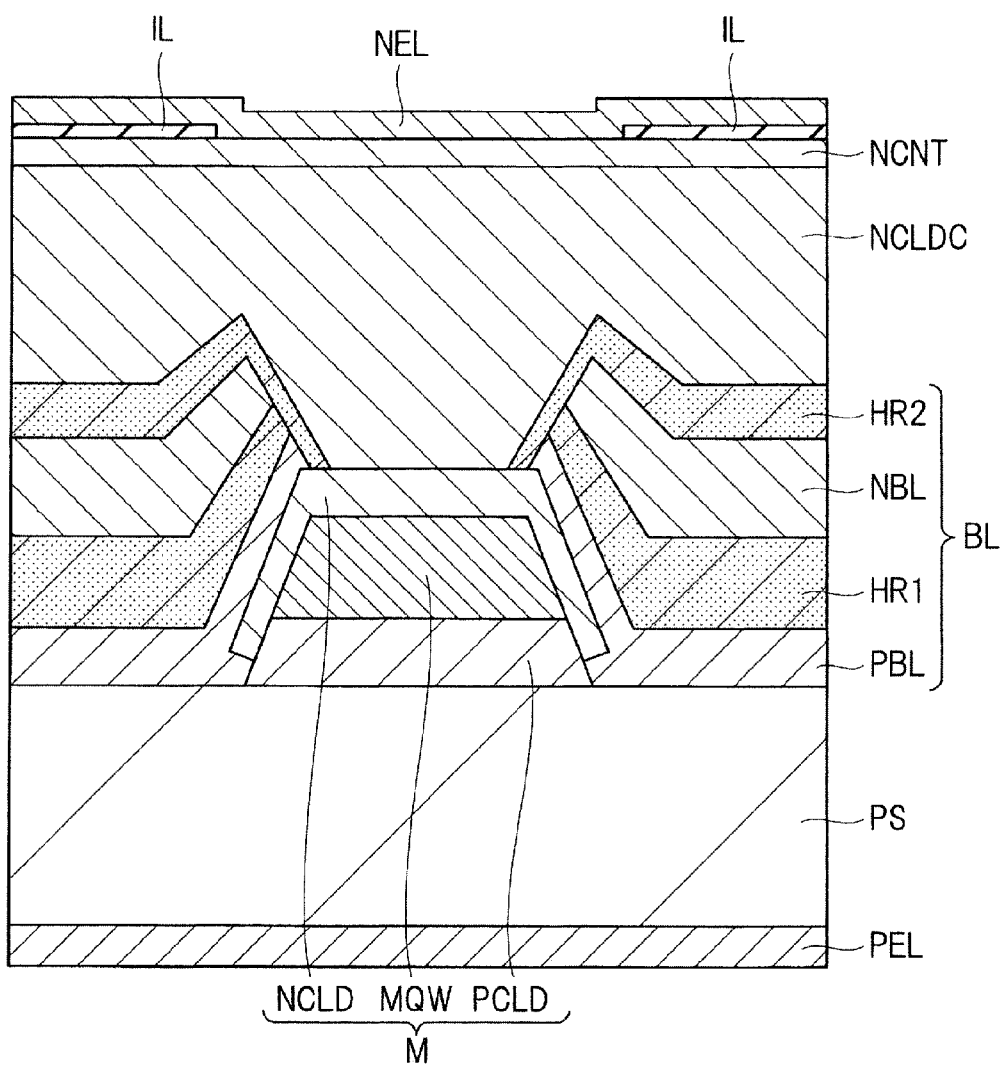
FIG. 13 is a sectional view illustrating a structure of a semiconductor laser according to Second Embodiment.

Hereinafter, a semiconductor laser (semiconductor device) according to the present embodiment will be described in detail with reference to the views. FIG. 13 is a sectional view illustrating a structure of the semiconductor laser according to the embodiment. A part almost the same as that in First Embodiment will be denoted with the same symbol and the detailed description thereof will be omitted.

[Description of Structure]

As illustrated in FIG. 13, the semiconductor laser according to the present embodiment uses a p-type substrate PS as a substrate, and has a mesa-type semiconductor part (ridge stripe part that is also referred to as a convex part) M over the substrate PS. Specifically, the mesa-type semiconductor part M includes a p-type cladding layer PCLD, an active layer MQW, and an n-type cladding layer NCLD, which are arranged in this order from below. The n-type cladding layer NCLD is arranged to cover the side surfaces of the p-type cladding layer PCLD and the active layer MQW. Thus, the semiconductor laser according to the embodiment has a structure in which the active layer MQW is sandwiched by semiconductor layers having conductivity types opposite to each other that are arranged over and below the active layer MQW. The mesa-type semiconductor part is processed into a line shape in the direction intersecting the plane of the paper.

The side surface of the mesa-type semiconductor part is covered with a block layer BL. In other words, the side surfaces of the p-type cladding layer PCLD and the active layer MQW are covered with the block layer BL via the n-type cladding layer NCLD. The block layer BL is arranged over the side surface of the mesa-type semiconductor part M and over the p-type substrate PS. The block layer BL includes a p-type block layer PBL, a high-resistance layer HR1, an n-type block layer NBL, and a high-resistance layer HR2, which are arranged in this order from below.

An n-side electrode NEL is arranged, via an n-type cladding protective layer NCLDC and an n-type contact layer NCNT, over the mesa-type semiconductor part M and the block layer BL on both the sides of the semiconductor part M; and a p-side electrode PEL is arranged in the rear surface of the p-type substrate PS. The n-side electrode NEL contacts the n-type contact layer NCNT via an opening in an insulating layer IL.

Herein, the high-resistance layer HR1 is provided between the p-type block layer PBL and the n-type block layer NBL that form the block layer BL also in the semiconductor laser according to the present embodiment, in almost the same way as that in First Embodiment, and hence a semiconductor laser having a low capacitance can be achieved. Further, a threshold value can be lowered. Furthermore, the manufacturing yield of the semiconductor lasers can be improved. The capacitance resulting from the p-n junction between the p-type block layer PBL and the n-type block layer NBL in the block layer BL can be reduced. Thereby, a high speed modulation characteristic is improved.

As a material for each component in the semiconductor laser according to the present embodiment, a material almost the same as that in First Embodiment can be used, and hence the description thereof will be omitted.

The operations of the semiconductor laser are almost the same as those in First Embodiment, and hence the description thereof will be omitted.

[Description of Manufacturing Method]

Subsequently, a manufacturing method of the semiconductor laser according to the present embodiment will be described and the structure of the semiconductor laser will be made clearer, with reference to FIGS. 14 to 21. FIGS. 14 to 21 are sectional views each illustrating a manufacturing step of the semiconductor laser according to the embodiment.

Figure 14:
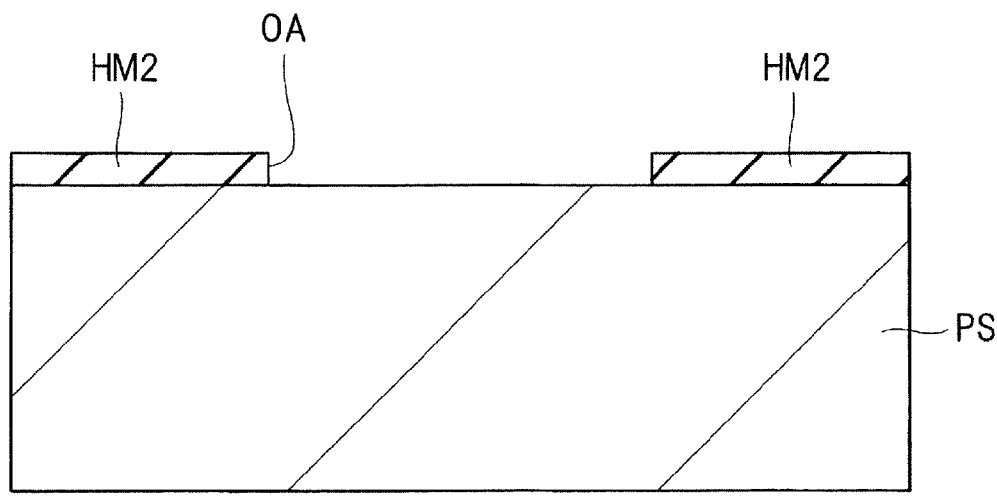
FIG. 14 is a sectional view illustrating a manufacturing step of the semiconductor laser according to Second Embodiment.

As illustrated in FIG. 14, a substrate including, for example, indium phosphide into which p-type impurities have been introduced is provided as the p-type substrate PS, and a hard mask (dielectric mask) HM2 is formed over the p-type substrate PS. A silicon oxide ($SiO_2$) film is formed over the p-type substrate PS by using, for example, a CVD method, or the like. Subsequently, a photoresist film (not illustrated) is coated over the hard mask HM2 (silicon oxide film), and thereafter a photoresist film, having an opening in a region where the mesa-type semiconductor part M is caused to remain, is formed by using a photolithography technique. Subsequently, the hard mask HM2 having an opening OA is formed by etching the hard mask HM2 (silicon oxide film) with the use of the photoresist film as a mask. Subsequently, the photoresist film is removed by asking, or the like. The opening OA is provided to have a line shape in the direction intersecting the plane of the paper.

Figure 15:
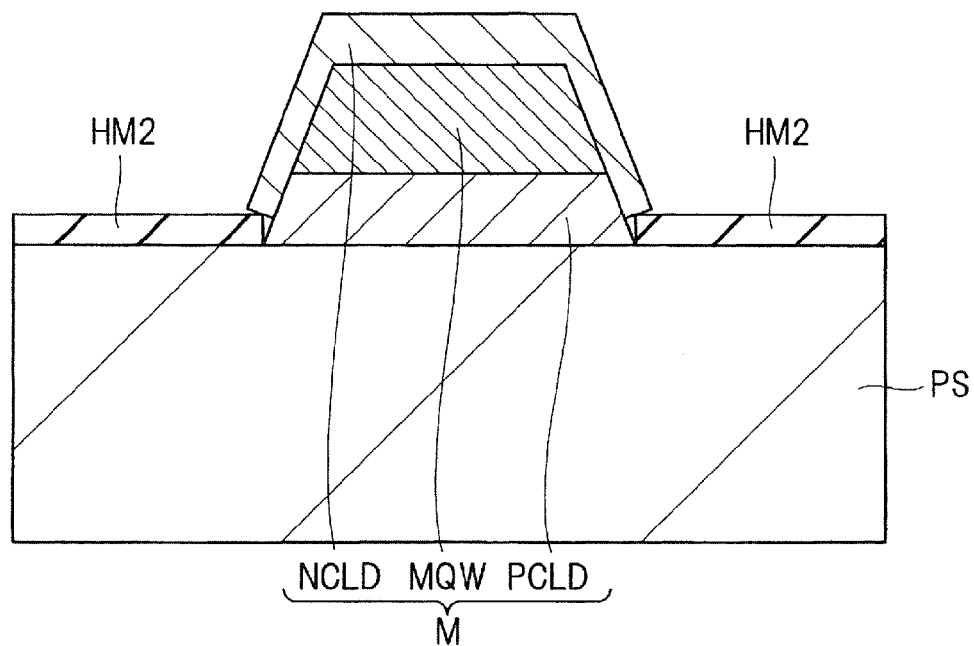
FIG. 15 is a sectional view illustrating a manufacturing step of the semiconductor laser according to Second Embodiment, which follows the manufacturing step of FIG. 14.

Subsequently, the mesa-type semiconductor part M is formed over the p-type substrate PS exposed from the opening OA, as illustrated in FIG. 15. A p-type InP layer is grown over the p-type substrate PS over which the hard mask HM2 has been formed, as the p-type cladding layer PCLD by using, for example, an MOVPE method. In this case, the p-type cladding layer (p-type InP layer) PCLD is selectively grown over the p-type substrate PS exposed from the opening OA. For example, in forming the p-type InP layer, a raw material almost the same as that in First Embodiment can be used.

Subsequently, an AlGaInAs layer is grown over the p-type cladding layer PCLD as the active layer MQW by using, for example, an MOVPE method. In this case, the active layer MQW is selectively grown over the p-type cladding layer (p-type InP layer) PCLD. For example, in forming the AlGaInAs layer, a raw material almost same as that in First Embodiment can be used.

Subsequently, an n-type InP layer is grown over the active layer MQW as the n-type cladding layer NCLD by using, for example, an MOVPE method. In this case, the n-type cladding layer (n-type InP layer) NCLD is also grown over the side surface of the laminated part of the p-type cladding layer (p-type InP layer) PCLD and the active layer (AlGaInAs layer) MQW. In other words, the n-type cladding layer (n-type InP layer) NCLD is grown over the upper surface and the side surface of the active layer (AlGaInAs layer) MQW. Thereby, oxidization of Al can be prevented even if a layer including Al is used as the active layer MQW.

Thus, the mesa-type semiconductor part M including the p-type cladding layer (p-type InP layer) PCLD, the active layer (AlGaInAs layer) MQW, and the n-type cladding layer (n-type InP layer) NCLD can be formed. In the laminated part of these layers, it is preferable that the n-type cladding layer (n-type InP layer) NCLD is formed to cover at least the side surface of the active layer (AlGaInAs layer) MQW.

Figure 16:
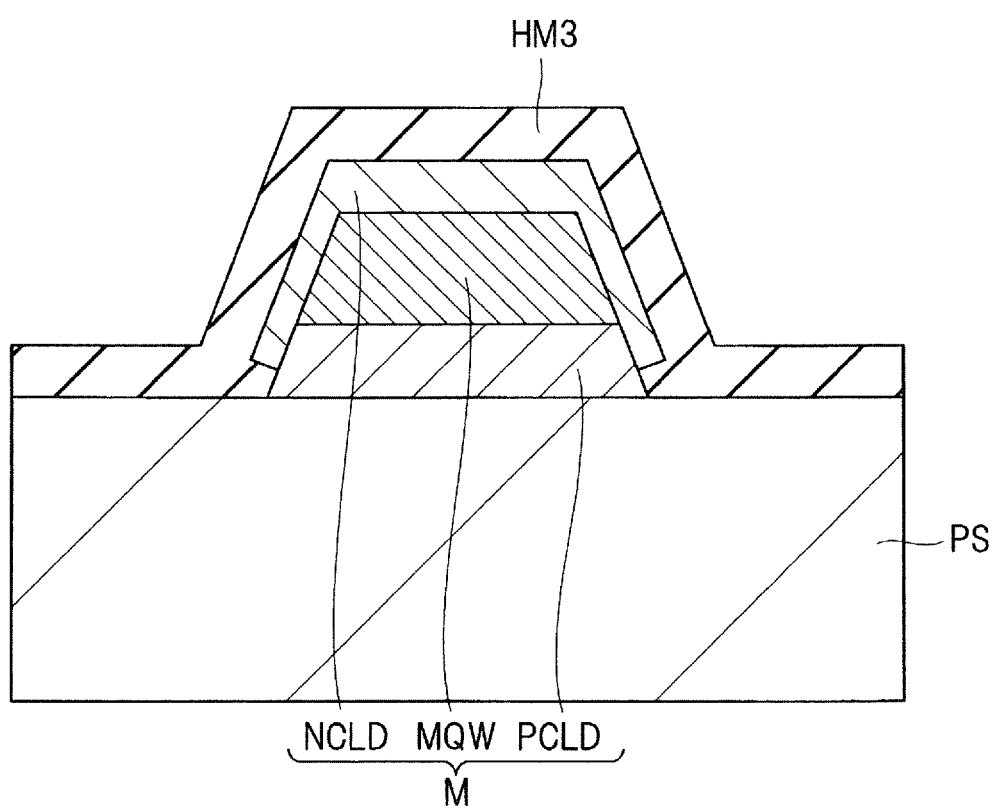
FIG. 16 is a sectional view illustrating a manufacturing step of the semiconductor laser according to Second Embodiment, which follows the manufacturing step of FIG. 15.
Figure 17:
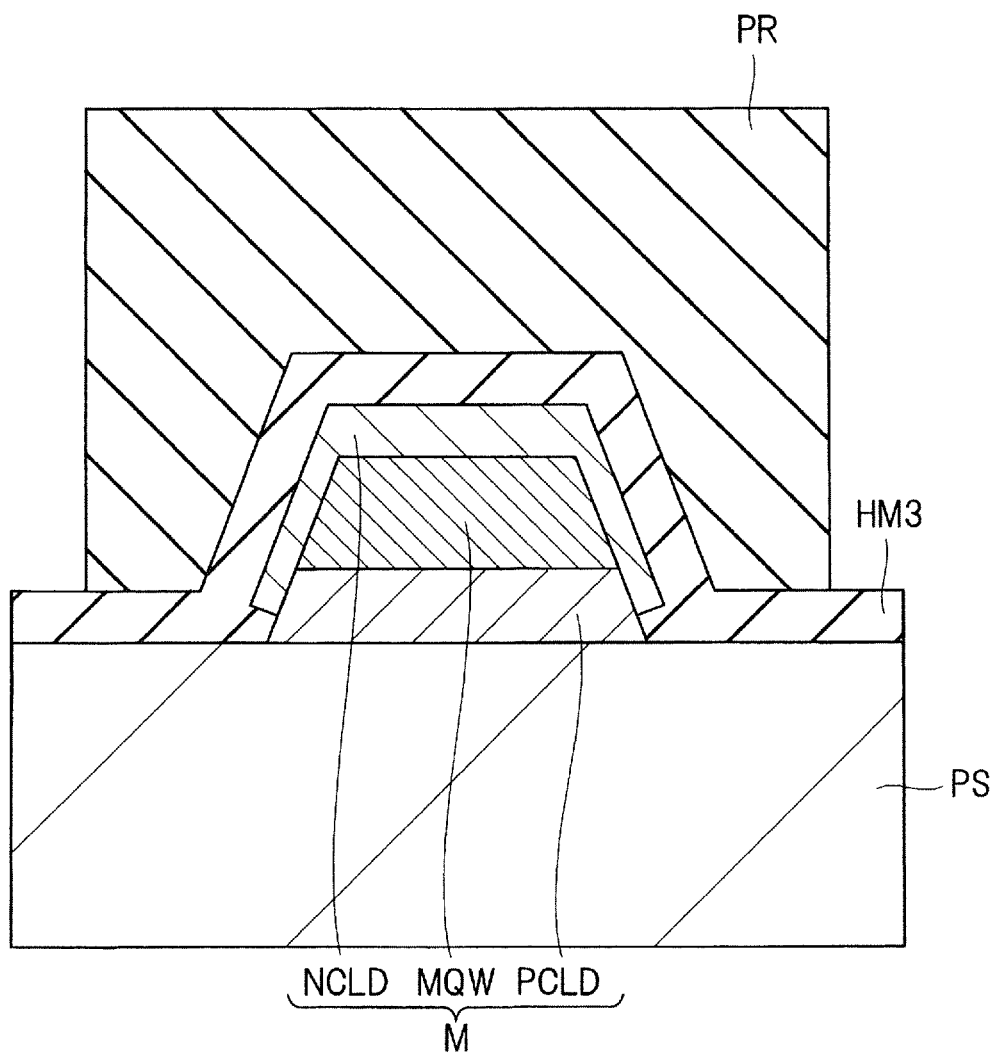
FIG. 17 is a sectional view illustrating a manufacturing step of the semiconductor laser according to Second Embodiment, which follows the manufacturing step of FIG. 16.
Figure 18:
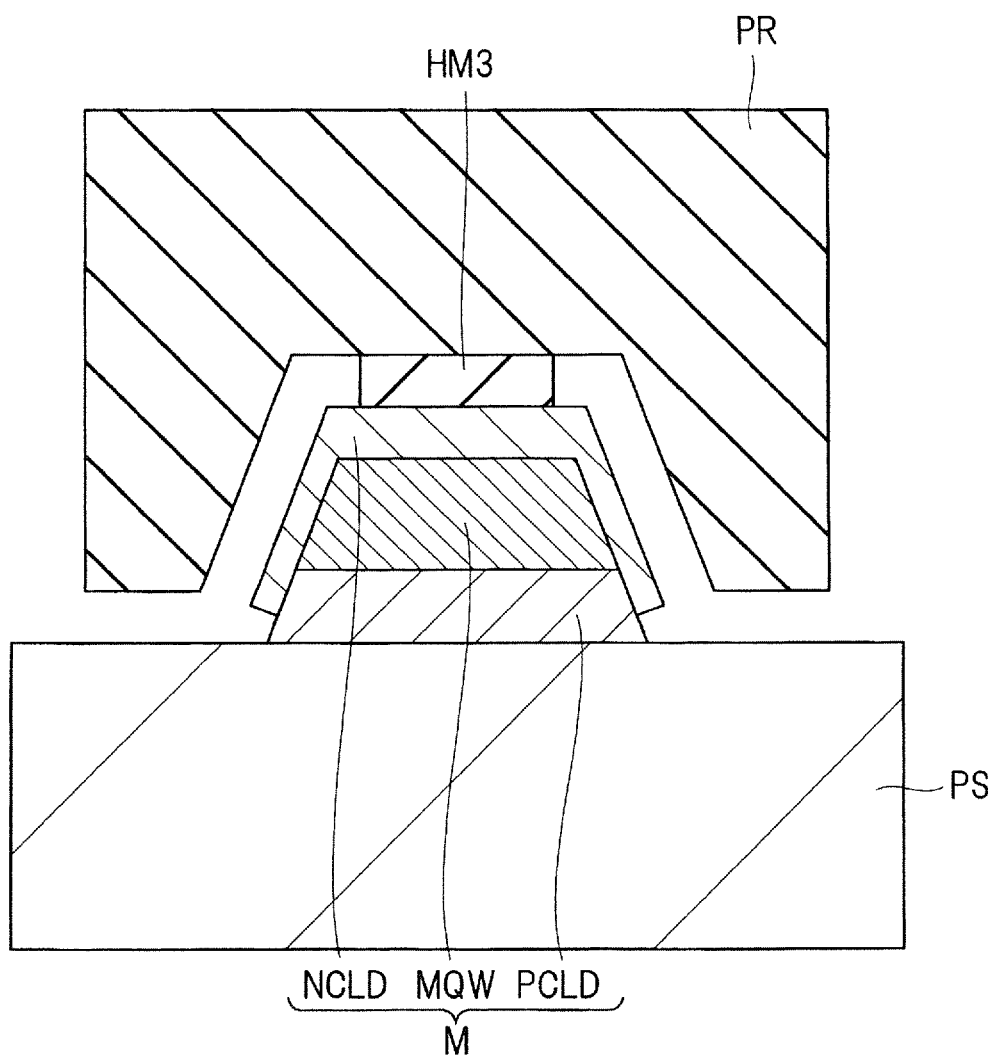
FIG. 18 is a sectional view illustrating a manufacturing step of the semiconductor laser according to Second Embodiment, which follows the manufacturing step of FIG. 17.

Subsequently, a hard mask HM3 is formed over the upper portion of the mesa-type semiconductor part M, as illustrated in FIGS. 16 to 18.

Figure 19:
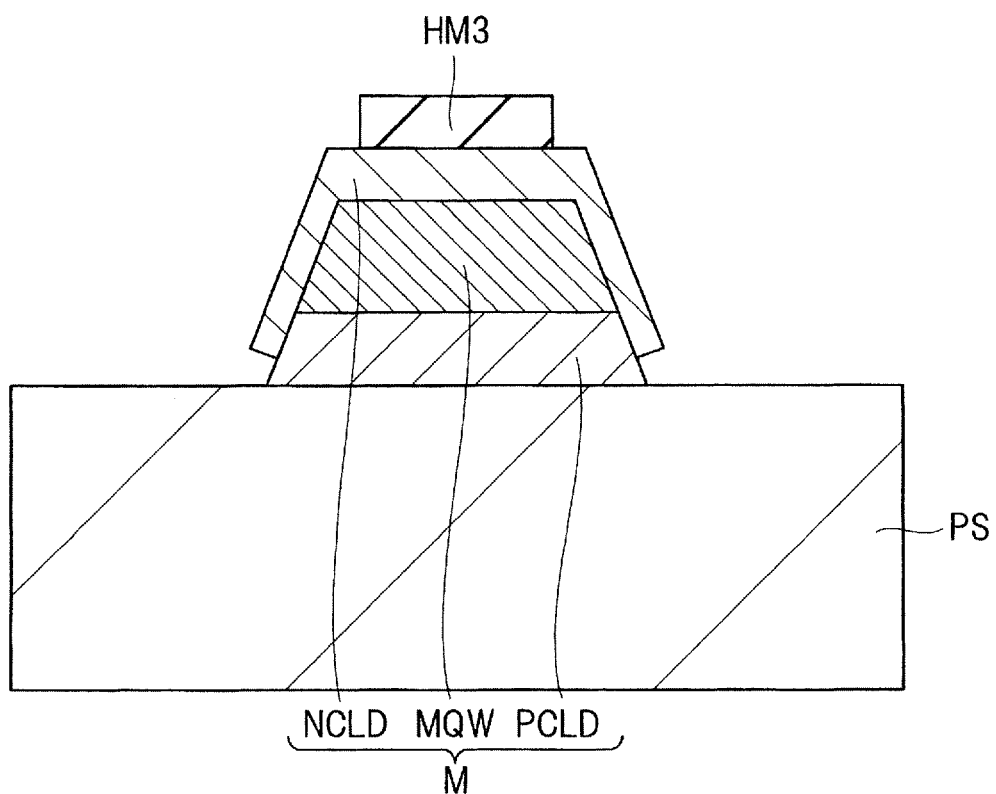
FIG. 19 is a sectional view illustrating a manufacturing step of the semiconductor laser according to Second Embodiment, which follows the manufacturing step of FIG. 18.

A silicon oxide ($SiO_2$) film is first formed over the p-type substrate PS including over the mesa-type semiconductor part M, as the hard mask HM3 by using, for example, a CVD method, or the like, as illustrated in FIG. 16. Subsequently, a photoresist film PR is coated over the hard mask HM3 (silicon oxide film), as illustrated in FIG. 17, and thereafter the photoresist film PR is caused to remain in a region including the mesa-type semiconductor part M by using a photolithography technique. The photoresist film PR is formed to cover the upper surface and the side surface of the mesa-type semiconductor part M via the hard mask HM3. The width of the photoresist film PR is, for example, approximately 5 μm. Subsequently, the hard mask HM3 is etched by using the photoresist film PR as a mask. For example, buffered fluoric acid can be used as an etching solution. In this case, the hard mask HM3 is caused to remain only over the upper surface of the mesa-type semiconductor part M by adjusting an etching time such that the hard mask HM3 that contacts the mesa-type semiconductor part M is etched (FIG. 18). Thereafter, the photoresist film PR is removed. Thereby, the upper surface of the mesa-type semiconductor part M is covered with the hard mask HM3, as illustrated in FIG. 19.

Figure 20:
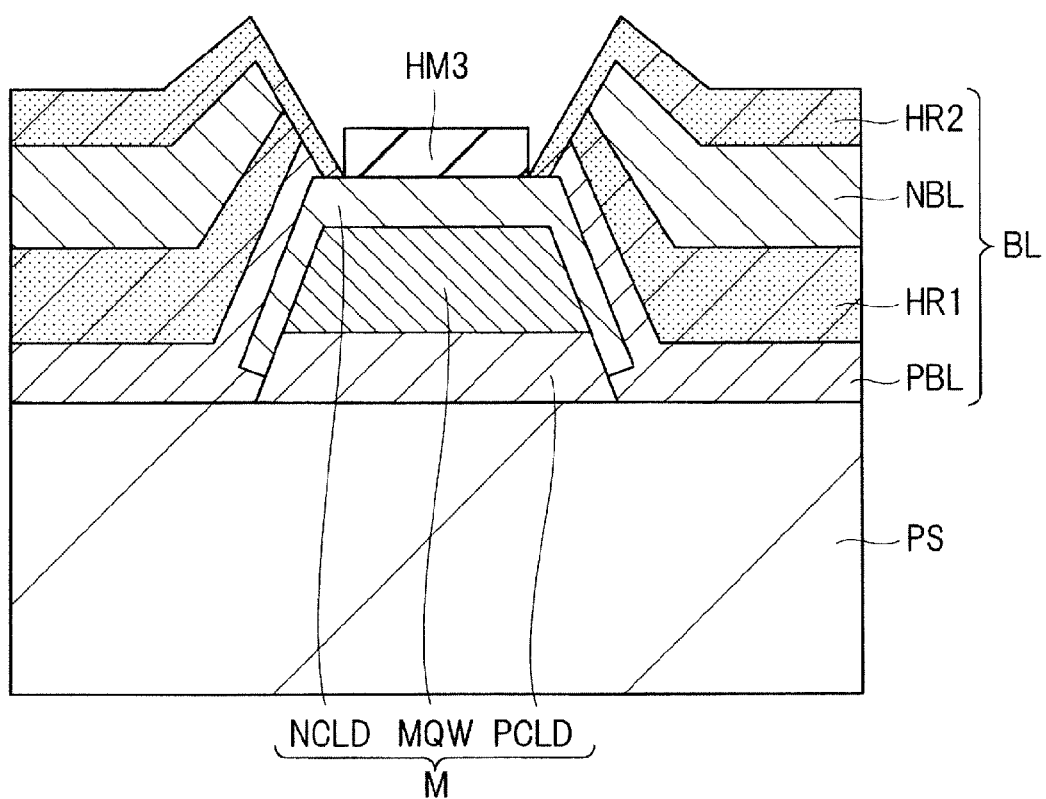
FIG. 20 is a sectional view illustrating a manufacturing step of the semiconductor laser according to Second Embodiment, which follows the manufacturing step of FIG. 19.

Subsequently, the block layer BL is formed over the p-type substrate PS on both the sides of the mesa-type semiconductor part M, as illustrated in FIG. 20.

The p-type block layer PBL is first formed over the side surface of the mesa-type semiconductor part M and over the p-type substrate PS. For example, a p-type InP layer is grown to have a thickness of approximately 0.1 μm, over the side surface of the mesa-type semiconductor part M and over the p-type substrate PS as the p-type block layer PBL by using, for example, an MOVPE method. In this case, for example, a raw material almost the same as that in First Embodiment can be used.

Subsequently, the high-resistance layer HR1 is formed over the p-type block layer PBL. In other words, the high-resistance layer HR1 is formed over the side surface of the mesa-type semiconductor part M and over the p-type substrate PS via the p-type block layer PBL. For example, an indium phosphide layer into which Fe (iron) has been introduced (Fe-doped InP layer) is grown to have a thickness of approximately 0.3 μm, over the p-type block layer PBL as the high-resistance layer HR1 by using, for example, an MOVPE method. In this case, for example, a raw material almost the same as that in First Embodiment can be used.

Subsequently, the n-type block layer NBL is formed over the high-resistance layer HR1. In other words, the n-type block layer NBL is formed over the side surface of the mesa-type semiconductor part M and over the p-type substrate PS via the p-type block layer PBL and the high-resistance layer HR1. For example, an n-type InP layer is grown over the high-resistance layer HR1 as the n-type block layer NBL by using, for example, an MOVPE method. In this case, for example, a raw material almost the same as that in First Embodiment can be used.

Subsequently, the high-resistance layer HR2 is formed over the n-type block layer NBL. In other words, the high-resistance layer HR2 is formed over the side surface of the mesa-type semiconductor part M and over the p-type substrate PS via the p-type block layer PBL, the high-resistance layer HR1, and the n-type block layer NBL. For example, an indium phosphide layer into which Fe (iron) has been introduced (Fe-doped InP layer) is grown to have a thickness of approximately 0.5 μm, over the n-type block layer NBL as the high-resistance layer HR2 by using, for example, an MOVPE method. In this case, for example, a raw material almost the same as that in First Embodiment can be used.

Thereby, the block layer BL can be formed over the p-type substrate PS on both the sides of the mesa-type semiconductor part M. In other words, the block layer BL, covering the side surface of the mesa-type semiconductor part M and the p-type substrate PS exposed on both the sides thereof, can be formed. Herein, each of the layers that form the block layer BL is not grown over the hard mask HM3.

Figure 21:
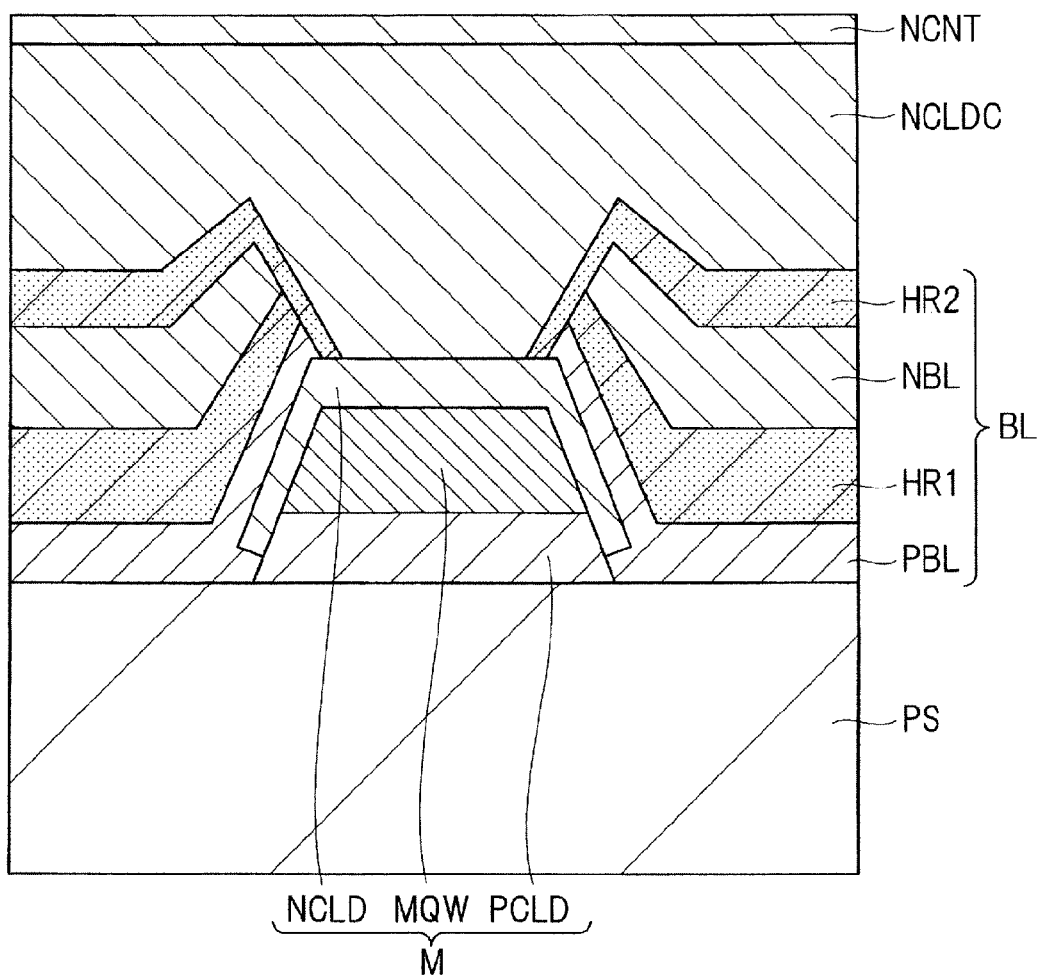
FIG. 21 is a sectional view illustrating a manufacturing step of the semiconductor laser according to Second Embodiment, which follows the manufacturing step of FIG. 20.

Subsequently, the n-type cladding protective layer NCLDC is formed over the mesa-type semiconductor part M and over the block layer BL on both the sides thereof, and the n-type contact layer NCNT is further formed over the protective layer NCLDC, as illustrated in FIG. 21.

The hard mask HM3 over the mesa-type semiconductor part M is first removed by etching. Thereby, the n-type cladding layer NCLD is exposed. The high-resistance layer HR2 is exposed on both the sides of the n-type cladding layer NCLD.

The n-type cladding protective layer NCLDC is formed over the n-type cladding layer NCLD and over the high-resistance layer HR2. For example, an n-type InP layer is grown over the n-type cladding layer NCLD and over the high-resistance layer HR2 as the n-type cladding protective layer NCLDC by using, for example, an MOVPE method. In this case, for example, a raw material almost the same as that in First Embodiment can be used.

An n-type semiconductor layer can be used as a cladding protective layer that covers over the mesa-type semiconductor part M, by thus using the p-type substrate PS as a substrate, and an element resistor can be reduced, as compared to the case where a p-type semiconductor layer is used as a cladding protective layer that covers over the mesa-type semiconductor part M, by using an n-type substrate.

Subsequently, the n-type contact layer NCNT is formed over the n-type cladding protective layer NCLDC. For example, an n-type InP layer is grown over the n-type cladding protective layer NCLDC as the n-type contact layer NCNT, for example, in almost the same way as that in First Embodiment.

Subsequently, a silicon oxide film is formed over the n-type contact layer NCNT as the insulating layer IL by using, for example, a CVD method, or the like, as illustrated in FIG. 13. Subsequently, the insulating layer IL above the mesa-type semiconductor part M is removed. The insulating layer IL is etched by using, for example, a photoresist film (not illustrated), having an opening in a region where the mesa-type semiconductor part M is to be formed, as a mask. Subsequently, the photoresist film is removed by asking, or the like.

Subsequently, the n-side electrode NEL is formed over the insulating layer IL and over the n-type contact layer NCNT exposed from the opening in the insulating layer IL in almost the same way as that in First Embodiment.

Subsequently, the thickness of the p-type substrate PS is made small by turning the substrate PS upside down so as to grind the rear surface of the substrate PS, and the p-side electrode PEL is formed in the rear surface of the p-type substrate PS in almost the same way as that in First Embodiment.

Thereafter, from the p-type substrate PS having a plurality of chip regions, every chip region is cut out in almost the same way as that in First Embodiment.

The semiconductor laser according to the present embodiment can be formed by the aforementioned steps.

Also in the semiconductor laser according to the present embodiment, the high-resistance layer HR1 is thus provided between the p-type block layer PBL and the n-type block layer NBL that form the block layer BL, in almost the same way as that in First Embodiment, and hence a threshold value can be lowered. Further, the manufacturing yield of the semiconductor lasers can be improved. Furthermore, the capacitance resulting from the p-n junction between the p-type block layer PBL and the n-type block layer NBL in the block layer BL can be reduced. Thereby, a high speed modulation characteristic is improved.

Furthermore, the flow of an electron can be narrowed over the active layer MQW according to the semiconductor laser of the present embodiment, because the n-type cladding layer NCLD is arranged to cover the side surfaces of the p-type cladding layer PCLD and the active layer MQW. Thereby, a leakage current flowing through the side surface of the active layer MQW can be reduced, and hence a threshold value can be lowered.

Third Embodiment

The applications of the semiconductor lasers described in the aforementioned First Embodiment and Second Embodiment are not limited, but they can be incorporated, for example, in the system described below.

Figure 22:
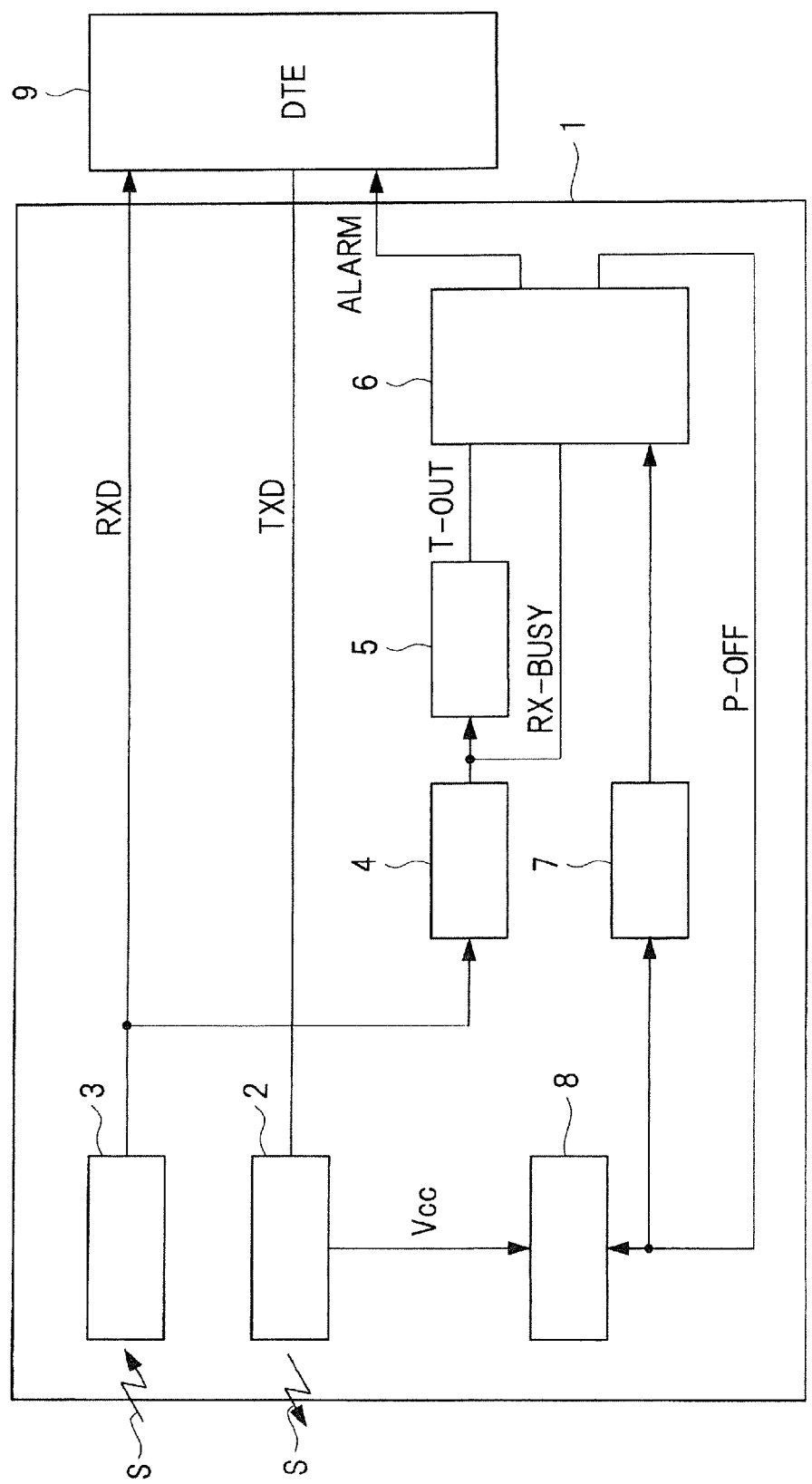
FIG. 22 is a block view illustrating an optical transceiver system using a semiconductor laser.

FIG. 22 is a block view illustrating an optical transceiver system using a semiconductor laser. An optical transceiver system 1 has an electricity-light conversion circuit 2, a light-electricity conversion circuit 3, a reception detection circuit 4, a timer circuit 5, an alarm circuit 6, an alarm reset circuit 7, and a power cutoff circuit 8.

The electricity-light conversion circuit 2 outputs an optical signal S by performing optical intensity modulation on a received electrical signal TXD from data terminal equipment (DTE) 9. The data terminal equipment (DTE) 9 is terminal equipment for data communication, and functions as the originating point and terminal point of data in order to control data communication by using a communication protocol.

The light-electricity conversion circuit 3 outputs a received electrical signal RXD to the data terminal equipment (DTE) 9 by receiving the optical signal S to amplify and demodulate it.

The reception detection circuit 4 generates a while-receiving signal RX-BUSY that becomes active through a period of time when a received signal is existing, by monitoring the received electrical signal RXD.

The timer circuit 5 is started at the active edge of the while-receiving signal RX-BUSY and is reset at the inactive edge thereof, and outputs a timeout signal T-OUT when a predetermined specified value is reached before the inactive edge is detected.

The alarm circuit 6 communicates an alarm signal ALARM to the data terminal equipment (DTE) 9 at timeout occurrence, and generates a power cutoff signal P-OFF When an active power cutoff signal P-OFF is detected, the alarm reset circuit 7 generates a random number, and after a quite random waiting time elapses, the alarm reset circuit 7 generates an alarm reset signal in order to release the alarm condition of the alarm circuit 6.

The power cutoff circuit 8 physically separates the power supply line, through which power is supplied to the electricity-light conversion circuit 2, by the active power cutoff signal P-OFF.

For example, a semiconductor laser can be used in the electricity-light conversion circuit 2 in the optical transceiver system 1 illustrated in FIG. 22. As described above, the electricity-light conversion circuit 2 outputs the optical signal S by converting the received electrical signal TXD. Such an electricity-light conversion circuit 2 is a transmission unit for the optical signal S, and is also referred to as TOSA (Transmitter Optical SubAssembly). A semiconductor laser can be incorporated in such an electricity-light conversion circuit 2 as an element for converting the received electrical signal TXD into the optical signal S; and by incorporating, for example, the semiconductor laser described in the aforementioned First Embodiment or Second Embodiment, the characteristics of the electricity-light conversion circuit 2 can be improved, and eventually the performance of the optical transceiver system 1 can be improved.

Figure 23:
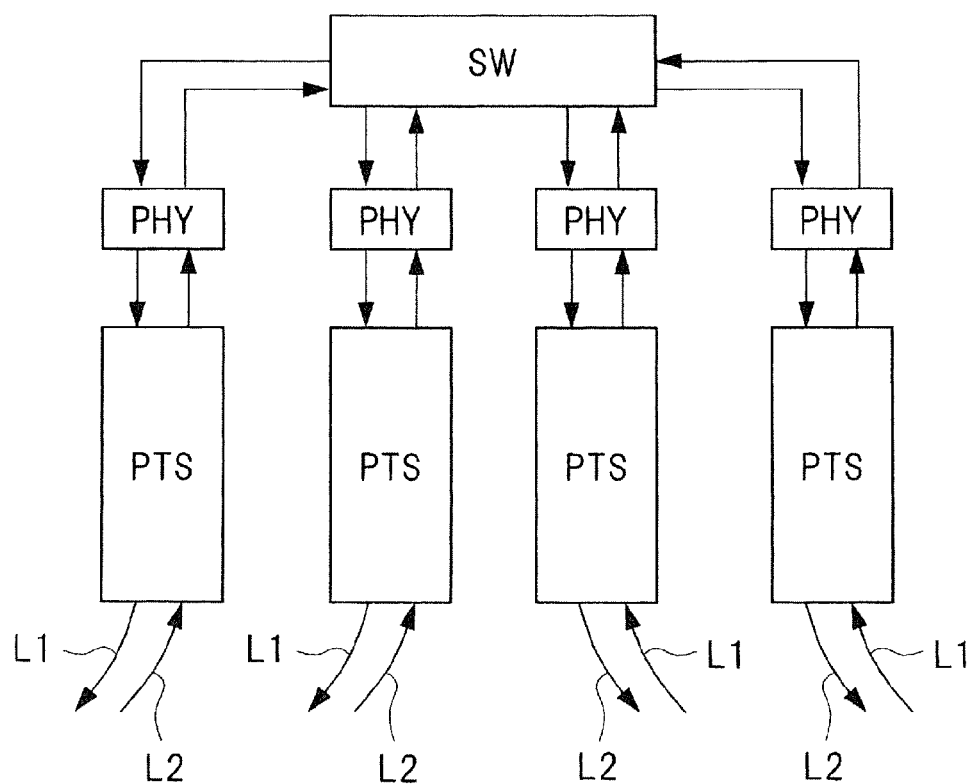
FIG. 23 is a block view illustrating an interface board system.

FIG. 23 is a block view illustrating an interface board system. The optical transceiver system illustrated in FIG. 22 can be incorporated in the interface board system illustrated in FIG. 23.

The interface board system has a plurality of slots (not illustrated), a plurality of signal processing circuits PHY, and an Ethernet switch SW. An optical transceiver system PTS is removably provided in the slot.

In the optical transceiver system PTS, a communication signal L2 received from an external device is converted into an electrical signal in the system PTS, so that it is received by the Ethernet switch SW after passing through the signal processing circuit PHY.

This Ethernet switch SW forwards the received electrical signal to the optical transceiver system PTS via the signal processing circuit PHY. Thereafter, the electrical signal received by the optical transceiver system PTS becomes a communication signal L1 by being converted into an optical signal in the system. PTS, which is transmitted and received by an external device.

By incorporating the semiconductor laser described in the aforementioned First Embodiment or Second Embodiment in such an interface board system, an interface board system with a high performance can be provided. Specifically, the semiconductor laser described in the aforementioned First Embodiment or Second Embodiment can be incorporated, for example, as a 25 Gb/s direct modulation type distributed feedback semiconductor laser (Distributed Feedback Laser Diode; DFB-LD) to be used for 100G Ethernet (registered trademark).

The invention made by the present inventors has been specifically described above based on preferred embodiments; however, it is needless to say that the invention should not be limited to the preferred embodiments and various modifications may be made to the invention within a range not departing from the gist of the invention.

What is claimed is:

1. A semiconductor laser comprising:
   a p-type semiconductor substrate;
   a convex part provided over the semiconductor substrate;
   a block layer provided on both sides of the convex part;
   wherein the convex part has:
   a p-type compound semiconductor layer formed over the semiconductor substrate;
   an active layer formed over the p-type compound semiconductor layer; and
   an n-type compound semiconductor layer formed over the active layer, and
   wherein the block layer includes:
   a p-type block layer including a p-type compound semiconductor formed over a side surface of the convex part and over the semiconductor substrate;
   a first resistive layer formed over the p-type block layer;
   an n-type block layer including an n-type compound semiconductor formed over the first resistive layer; and
   a second resistive layer formed over the n-type block layer that contacts and covers a portion of the n-type compound semiconductor layer,
   wherein the first resistive layer has a resistance larger than that of the p-type block layer, and
   wherein the n-type compound semiconductor layer covers entire side surfaces of the active layer and a portion of side surfaces of the p-type compound semiconductor layer formed over the substrate.

2. The semiconductor laser according to claim 1, wherein the first resistive layer is a compound semiconductor into which Fe (iron) has been introduced.

3. The semiconductor laser according to claim 1, wherein the second resistive layer is a compound semiconductor into which Fe (iron) has been introduced.

4. The semiconductor laser according to claim 1, wherein a thickness of the p-type block layer is 0.2 μm or less.

5. The semiconductor laser according to claim 1, wherein a thickness of the p-type block layer is 0.1 μm or less.

6. The semiconductor laser according to claim 1, wherein each of the p-type compound semiconductor layer and the p-type block layer is InP including a p-type impurity, and
   wherein each of the n-type compound semiconductor layer and the n-type block layer is InP including an n-type impurity, and
   wherein the first resistive layer is InP into which Fe (iron) has been introduced.

7. The semiconductor laser according to claim 1 comprising:
   a layer including an n-type compound semiconductor formed over the convex part and the block layer,
   wherein a first electrode is formed above the layer, and
   wherein a second electrode is formed in a rear surface of the semiconductor substrate.

8. The semiconductor laser according to claim 1, wherein the block layer includes a semiconductor layer selectively grown over the semiconductor substrate.

* * * * *